(12) United States Patent
Shih et al.

(10) Patent No.: US 9,906,206 B2
(45) Date of Patent: Feb. 27, 2018

(54) TUNABLE SURFACE ACOUSTIC WAVE RESONATORS AND FILTERS

(71) Applicants: Ishiang Shih, Brossard (CA); Cindy X. Qiu, Brossard (CA); Chunong Qiu, Brossard (CA); Andy Shih, Brossard (CA); Julia Qiu, Brossard (CA); Yi-Chi Shih, Los Angeles, CA (US)

(72) Inventors: Ishiang Shih, Brossard (CA); Cindy X. Qiu, Brossard (CA); Chunong Qiu, Brossard (CA); Andy Shih, Brossard (CA); Julia Qiu, Brossard (CA); Yi-Chi Shih, Los Angeles, CA (US)

( * ) Notice: Subject to any disclaimer, the term of this patent is extended or adjusted under 35 U.S.C. 154(b) by 116 days.

(21) Appl. No.: 14/999,711

(22) Filed: Jun. 20, 2016

(65) Prior Publication Data

US 2017/0366165 A1 Dec. 21, 2017

(51) Int. Cl.
*H03H 9/145* (2006.01)
*H03H 9/25* (2006.01)
*H03H 9/64* (2006.01)
*H03H 9/02* (2006.01)

(52) U.S. Cl.
CPC ........ *H03H 9/145* (2013.01); *H03H 9/02614* (2013.01); *H03H 9/02976* (2013.01); *H03H 9/25* (2013.01); *H03H 9/64* (2013.01)

(58) Field of Classification Search
CPC .......... H03H 9/02543; H03H 9/02614; H03H 9/02976; H03H 9/145; H03H 9/14538; H03H 9/25; H03H 9/64
USPC .......... 333/193–195, 313 B, 313 D
See application file for complete search history.

(56) References Cited

U.S. PATENT DOCUMENTS

| | | | | |
|---|---|---|---|---|
| 4,069,507 A * | 1/1978 | Defranould | ............ | H04N 3/10 250/214.1 |
| 4,358,745 A * | 11/1982 | Keyes | ............... | H03H 9/02543 257/416 |
| 5,576,589 A * | 11/1996 | Dreifus | ............. | H03H 9/02582 310/313 A |
| 6,984,540 B2 * | 1/2006 | Takase | .................... | H03H 3/08 438/48 |
| 7,687,971 B2 * | 3/2010 | Stokes | .............. | H03H 9/02574 310/313 B |
| 7,755,455 B2 * | 7/2010 | Kong | ................... | H03H 9/6403 333/133 |

* cited by examiner

*Primary Examiner* — Barbara Summons

(57) ABSTRACT

Due to strong needs to reduce the dimensions and the cost of the RF filters and to reduce the number of filters required in an mobile handsets and wireless system covering numbers of operation bands, tunable RF filters which can cover as many bands or frequency ranges as possible are needed so that the number of filters can be reduced in the mobile handsets and wireless systems. This invention provides tunable surface acoustic wave resonators and filters utilizing semiconducting piezoelectric layers having embedded or elevated electrode doped regions. Both metallization ratio and loading mass are changed by varying a DC biasing voltage to effect a change in the resonant frequency of the tunable SAW devices.

26 Claims, 7 Drawing Sheets

Fig. 1                                                          Prior Art
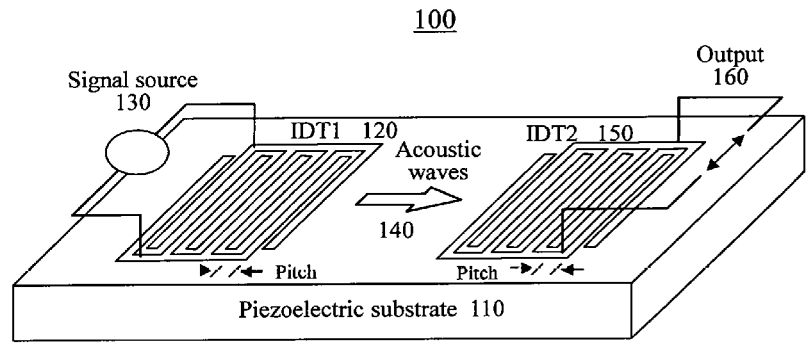
Fig. 2                                                  Prior Art
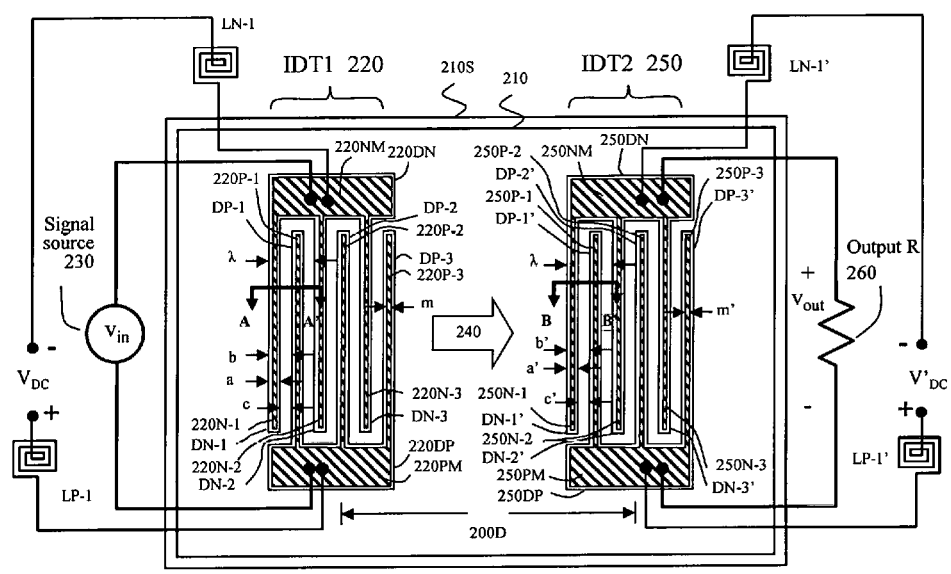

TUNABLE SURFACE ACOUSTIC WAVE RESONATORS AND FILTERS

FIELD OF THE INVENTION

This invention relates to tunable filtering of frequency and generation of frequency of RF signals for communication systems. More specifically, it relates to tunable surface acoustic wave IDTs for SAW resonators and filters.

BACKGROUND OF THE INVENTION

Electronic systems especially those for communications applications operated at radio frequencies (RF) require small bandpass filters and oscillators. The oscillators are for generation of frequency signals and the bandpass filters are for selection of (transmit or receive) signals within certain bandwidth (BW) at a given frequency. Some examples of the systems include global positioning systems (GPS); mobile telecommunication systems: Global Systems for Mobile Communications (GSM), personal communication service (PCS), Universal Mobile Telecommunications System (UMTS), Long Term Evolution Technology (LTE); data transfer units: Bluetooth, Wireless Local Area Network (WLAN); satellite broadcasting and future traffic control communications. They also include other high frequency systems for air and space vehicles.

Bandpass filters for RF signals are fabricated using different technologies: (a) ceramic filters based on dielectric resonators, (b) filters using surface acoustic wave resonators (SAW), and (c) filters using thin film bulk acoustic wave resonators (FBAR). Both SAW and FBAR are used when dimensions of the systems are limited. Currently, SAW devices are mainly used in volume applications at frequencies below 2 GHz whereas FBARs are dominant in systems operated at frequencies from 2 to 4 GHz. Due to large volumes, SAW or FBAR RF filters in handsets are manufactured by microelectronic fabrication processes on wafers using piezoelectric materials such as $LiNbO_3$ (for SAWs) and AlN (for FBARs).

Surface Acoustic Wave (SAW) Filters

The development of SAW devices dated back to 1965, when the first SAW devices were made. Earlier research work in SAW devices was mainly to fulfill the needs of radar signal processing. In the 1980s and 1990s, the main development efforts were focused on low loss filters particularly for mobile phones. The basic principles of SAW devices can be understood by considering a basic SAW structure. FIG. 1 shows a schematic diagram of a prior art surface acoustic wave filter (100) on a piezoelectric substrate (110), with an input inter digital transducer IDT1 (120) with a center-to-center distance between adjacent electrodes controlled to a "pitch" and connected to an electrical signal source (130) to excite acoustic waves (140) with a velocity v and at a frequency $f_o=v/(2\times pitch)$, an output inter digital transducer IDT2 (150) with a center-to-center distance between adjacent electrodes again also controlled to the "pitch" to receive the acoustic waves (140) and covert them into an output electrical signal (160). Electrical signals in the signal source (130) at frequencies other than $f_o$ cannot excite resonant acoustic waves with sufficient level to reach the output IDT2 (150) to generate an output in the output terminals. Once a SAW filter is fabricated, the central frequency $f_o$ of transmission and bandwidth BW are fixed by the geometry of the filter and by materials used. The only electrical signals that are allowed to reach the output inter digital transducer from the input inter digital transducer are those with a frequency to be within the bandwidth of a center frequency $f_o$.

The main properties of piezoelectric materials for filters are propagation velocity of acoustic waves, electrode pitch and coupling coefficients, where the velocity of acoustic waves and the electrode pitch determine the resonant frequency and the coupling coefficients affect the band width. Velocities values for several piezoelectric substrates are: $LiNbO_3 \sim 4,000$ m/s, $ZnO \sim 6,300$ m/s, $AlN \sim 10,400$ m/s and $GaN \sim 7,900$ m/s. As an example, to obtain a filter on $LiNbO_3$ with a central frequency $f_o=2$ GHz, the wavelength of the acoustic wave is $\lambda=(4000 \text{ msec})/(2\times 10^9/\text{sec})=2\times 10^{-4}$ cm. Therefore, the value of electrode pitch in FIG. 1 is then equal to $(\frac{1}{2})\lambda$ or 1 μm. Assuming that the width of electrodes and the space between adjacent electrodes are equal, the electrode width is then 0.5 μm.

Tunable Filters

For each communication band, there are two frequencies close to each other: one for transmitting and the other for receiving. For mobile communications, there are about 40 bands. More bands are expected for the next generation long term extension technology. Table 1 gives several selected bands for mobile communications used in different regions or countries. In each band, there is a transmit band or Tx Band at a transmit band central frequency $f_{oTR}$ with a transmit bandwidth $BW_{TR}$. There is also an associated receive band or Rx Band at a receive band central frequency $f_{oRE}$ with a receive bandwidth $BW_{RE}$. The separation between the transmit band and the receive band is given by: $f_{oRE}-f_{oTR}$.

Table 1 Band frequencies and bandwidth for some of the bands assigned to mobile handsets and base stations.

TABLE 1

Band frequencies and bandwidth for some of the bands assigned to mobile handsets and base stations.

| Band | $f_{oTR}$ (MHz) | $BW_{TR}$ (MHz) | $f_{oRE}$ (MHz) | $BW_{RE}$ (MHz) | $f_{oRE}-f_{oTR}$ (MHz) | $(f_{oRE}-f_{oTR})/f_{oTR}$ | Region |
|---|---|---|---|---|---|---|---|
| 1 | 1920-1980 | 60 | 2110-2170 | 60 | 190 | 9.8% | Asia, EMEA, Japan |
| 2 | 1850-1910 | 60 | 1930-1990 | 60 | 80 | 4.3% | N. America, Latin Am. |
| 3 | 1710-1785 | 75 | 1805-1880 | 75 | 95 | 5.4% | Asia, EMEA |
| 4 | 1710-1755 | 45 | 2110-2155 | 45 | 400 | 23% | N. America, Latin Am. |
| 5 | 824-849 | 25 | 869-894 | 25 | 45 | 5.4% | N. America, Latin Am. |
| 7 | 2500-2570 | 70 | 2620-2690 | 70 | 120 | 4.7% | Asia, EMEA |
| 8 | 880-915 | 35 | 925-960 | 35 | 45 | 5.0% | EMEA, Latin Am. |
| 12 | 699-716 | 17 | 729-746 | 17 | 30 | 4.2% | N. America |

Due to the large number of bands used in the mobile handsets in different regions and countries, and even in the same country, a practical handset needs to have an RF front end covering several frequency bands. A true world phone will need to have about 40 bands, each with a transmit band and receive band. As each RF filter has only one central frequency of resonant and a bandwidth which are fixed, therefore, such a true world phone will need to have 80 filters for the front end. Due to the resource limitations, some designers design mobile phone handsets to cover 5 to 10 bands for selected regions or countries. Even with this reduced number of bands, the number of RF filters currently required is still large (10 to 20 units). Therefore, there is a strong need to reduce the dimensions/cost of the RF filters and to reduce the number of filters for the same number of operation bands by using tunable RF filters, each to cover at least two frequency bands, so that the number of filters can be reduced in the mobile handsets and many other microwave and wireless systems. Thus, it would be ideal to develop an RF filter which can cover as many bands or frequency ranges as possible so that the size and power consumption of RF front ends in a mobile phone handset and microwave systems can be reduced. In Table 1, values of $(f_{oRE}-f_{oTR})/f_{oTR}$ are listed. It is seen that majority has a value of 10% or less: mostly ~5%. Therefore, tunable filters with a tuning range of 10% or more will be highly valuable for communications.

In order to fulfill the demands for RF filters covering as many bands or frequency ranges as possible, tunable SAW inter digital transducers and reflectors have been invented and disclosed in U.S. patent application Ser. No. 14/756,554 by the inventors of the present application. This invention provides tunable surface acoustic wave resonators utilizing semiconducting piezoelectric layers having embedded or elevated electrode doped regions. Both metallization ratio and loading mass are changed by varying a DC biasing voltage to effect a change in the resonant frequency. A plurality of the present tunable SAW devices may be connected into a tunable and selectable microwave filter for selecting and adjusting of the bandpass frequency or an tunable oscillator by varying the DC biasing voltages.

Tunable SAW IDTs and Filters

FIG. 2 shows a schematic top view of a tunable surface acoustic wave (SAW) filter (200a) disclosed in U.S. patent application Ser. No. 14/756,554 by the inventors of the present application. The SAW filter (200a) has an input inter digital transducer IDT1 (220) and an output inter digital transducer IDT2 (250). The IDT1 and the IDT2 are made on a first piezoelectric layer (210) deposited on a support substrate (210S). The first piezoelectric layer (210) in the SAW structures is selected from a group of piezoelectric materials including: $LiNbO_3$, $LiTaO_3$, ZnO, AlN, GaN, AlGaN, $LiTaO_3$, GaAs, AlGaAs and etc.

The IDT1 (220) comprises an input positive electrode pad (220PM) on an input positive electrode pad doped region (220DP); an input negative electrode pad (220NM) on an input negative electrode pad doped region (220DN); input positive electrode fingers (220P-1, 220P-2, 220P-3) each on one of the respective input positive electrode doped regions (DP-1, DP-2, DP-3); input negative electrode fingers (220N-1, 220N-2, 220N-3) each on one of the respective input negative electrode doped regions (DN-1, DN-2, DN-3). The input positive electrode doped regions (DP-1, DP-2, DP-3) and input negative electrode doped regions (DN-1, DN-2, DN-3) are doped piezoelectric semiconductors. A center-to-center distance between adjacent input positive electrode fingers and input negative electrode fingers (or between the input positive electrode doped regions and the input negative electrode doped regions) is controlled to a "pitch" b. The input electrode fingers are connected to an electrical signal source (230) to excite surface acoustic waves (240) at a frequency f~v/(2×b), v being the velocity of the surface acoustic waves. Similarly, the output inter digital transducer IDT2 (250) comprises an output positive electrode pad (250PM) on an output positive electrode pad doped region (250DP); an output negative electrode pad (250NM) on an output negative electrode pad doped region (250DN); output positive electrode forgers (250P-1, 250P-2, 250P-3) each on one of the respective input positive electrode doped regions (DP-1', DP-2', DP-3'); output negative electrode fingers (250N-1, 250N-2, 250N-3) each on one of the respective output negative electrode doped regions (DN-1', DN-2', DN-3'). The output positive electrode doped regions (DP-1', DP-2', DP-3') and output negative electrode doped regions (DN-1', DN-2', DN-3') are doped piezoelectric semiconductors. A center-to-center distance between adjacent output positive electrode fingers and output negative electrode fingers (or between adjacent output positive electrode doped regions and output negative electrode doped regions) is controlled to the "pitch" b' which is preferably the same as b to receive the surface acoustic waves (240) and covert them into an output electrical signal $V_{out}$ across an output resistor R (260).

The input inter digital transducer (220) and output inter digital transducer (250) are kept apart by an IDT center-to center distance (200D). The Input electrode doped region widths (a) are kept to be substantially equal to half of the pitch (b) so that spacing between adjacent input electrode doped regions (c) is also substantially equal to half of the pitch (b). Similarly, the output electrode doped region width (a'=a) is kept to be substantially equal to half of the pitch (b'=b) so that spacing between adjacent output electrode doped regions (c') is also substantially equal to half of the pitch (b'=b). The input electrode finger width (m) is selected to be the same as the output electrode finger width (m') and the finger widths (m, m') are no more than electrode doped region widths (a, a').

An input DC biasing voltage $V_{DC}$ is connected to the input inter digital transducer IDT1 through blocking inductors LN-1 and LP-1 to tune and adjust the frequency of the surface acoustic waves to be excited by IDT1 whereas an output DC biasing voltage $V'_{DC}$ is connected to the output inter digital transducer through blocking inductors LN-1' and LP-1' to tune and adjust frequency of the surface acoustic waves to be received or detected by IDT2. Value of the input DC biasing voltage $V_{DC}$ is preferably selected to be same as the output DC biasing voltage $V'_{DC}$ to achieve synchronous tuning and adjustment for the frequencies. The value of pitch (b, b') is selected during the design and fabrication of the SAW device and the wavelength of surface acoustic waves to be excited and to propagate is: $\lambda=2b$. The value of λ together with the velocity v of the surface acoustic waves thus determine a unique central frequency $f=v/\lambda$ of the excitation, propagating and detection of surface acoustic waves. The tuning of frequency is based on the adjustment of mass loading (ML) and metallization ratio (MR) associated with the electrode doped regions and electrode fingers which can be found in extensive detail in U.S. patent application Ser. No. 14/756,554.

In this earlier invention, as described above, the DC biasing voltages are provided through blocking inductors (LN-1, LP-1, LN-1', LP-1') to the input and output IDTs, wherein the blocking inductors are to separate the DC bias and the RF signals. While thin film inductors (LN-1, LP-1, LN-1', LP-1') are effective in isolating RF signals from the DC biasing circuit, thin film inductors have two disadvantages. Thin film inductors are usually made as metal coils which occupy fairly large areas and thin film coils are relatively difficult to fabricate and therefore are not practical. Therefore, tunable SAW IDTs with an improved RF isolation method are needed for practical tunable SAW resonator, filters or oscillators.

BRIEF SUMMARY OF THE INVENTION

One object of the invention is to provide tunable SAW IDTs for SAW resonators, filters or oscillators wherein the central frequency of the surface acoustic waves to be excited and to be received are tuned by DC bias voltages applied to the input IDTs and the output IDTs through integrated thin film bias resistors.

One other object of the invention is to provide frequency tunable SAW IDTs with embedded negative and positive electrode doped regions and integrated thin film bias resistors for SAW RF resonator, filter or oscillator for wireless or microwave systems, wherein the conduction type of the embedded negative electrode doped regions and that of the embedded positive electrode doped regions are different.

Another object of the invention is to provide frequency tunable SAW IDTs with embedded negative and positive electrode doped regions and integrated thin film bias resistors for SAW RF resonator, filter or oscillator for wireless or microwave systems, wherein the conduction type of the embedded negative electrode doped regions and that of the embedded positive electrode doped regions are the same.

Yet another object of the invention is to provide frequency tunable SAW IDTs with elevated electrode doped regions and integrated thin film bias resistors for SAW RF resonator, filter or oscillator for wireless or microwave systems, wherein the conduction type of the elevated negative electrode doped regions and that of the elevated positive electrode doped regions are different.

Still another object of the invention is to provide frequency tunable SAW IDTs with elevated electrode doped regions and integrated thin film bias resistors for SAW RF resonator, filter or oscillator for wireless or microwave systems, wherein the conduction type of the elevated negative electrode doped regions and that of the elevated positive electrode doped regions are the same.

Yet one other object of the invention is to control the doping concentration of the positive and negative electrode doped regions in the tunable SAW inter digital transducers to be in a range of $10^{13}$-$10^{20}$ cm$^{-3}$.

BRIEF DESCRIPTION OF THE SEVERAL VIEWS OF THE DRAWING

FIG. 1 shows a schematic diagram of a prior art surface acoustic wave filter (100a) on a piezoelectric substrate having an input inter digital transducer IDT1 to excite surface acoustic waves and an output inter digital transducer IDT2 to receive the surface acoustic waves and covert them into an output electrical signal.

FIG. 2 is a schematic top view showing a prior art tunable SAW filter (200a) with tunable frequency. An input DC biasing voltage $V_{DC}$ is connected to an input inter digital transducer IDT1 through blocking conductors (LP-1, LN-1) to adjust the frequency of the excited surface acoustic waves. An output DC biasing voltage $V'_{DC}$ is connected to an output inter digital transducer IDT2 through blocking conductors (LP-1', LN-1') to adjust the frequency of the surface acoustic waves to be received.

DETAILED DESCRIPTION OF THE INVENTION

Structures for tunable surface acoustic waves (SAW) inter digital transducers and reflectors for SAW devices such as SAW filters, oscillators and other devices with integrated thin film resistors for RF and DC isolation are provided according to this invention.

Tunable SAW IDTs with Integrated Thin Film Blocking Resistors

Figure 3A:
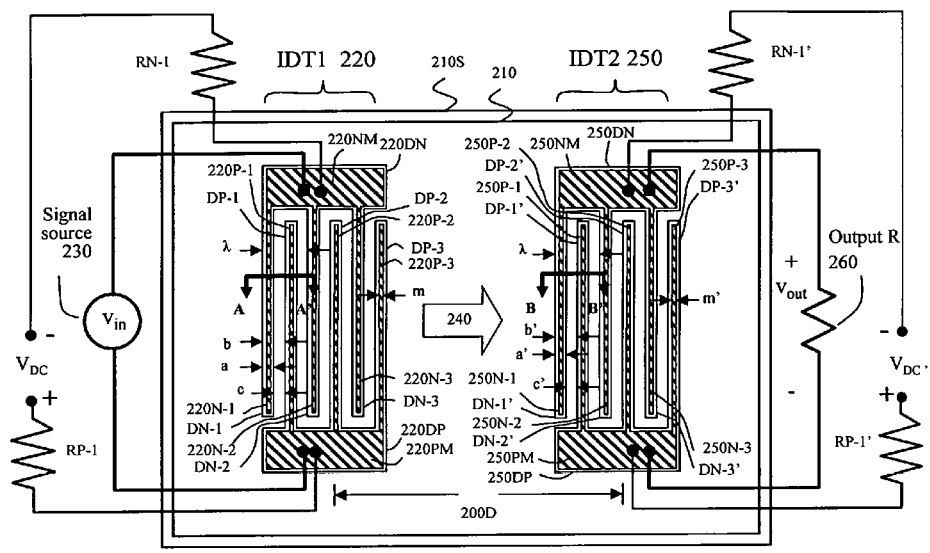
FIG. 3A shows a schematic top view of a SAW filter (300a) with tunable frequency, according to the present invention. An input DC biasing voltage $V_{DC}$ is applied to an input inter digital transducer IDT1 through integrated thin film bias resistors (RP-1, RN-1) to adjust the frequency of the excited surface acoustic waves. An output DC biasing voltage $V_{DC'}$ is applied to an output inter digital transducer IDT2 through integrated thin film bias resistors (RP-1', RN-1') to adjust the frequency of the surface acoustic waves to be received.

FIG. 3A shows a schematic top view of a tunable surface acoustic wave (SAW) filter (300a) according this invention. The tunable SAW filter (300a) has an input inter digital transducer IDT1 (220) and an output inter digital transducer IDT2 (250) and it is made on a first piezoelectric layer (210) and a support substrate (210S). In SAW filter (300a), an input DC biasing voltage $V_{DC}$ is connected to the input inter digital transducer IDT1 through integrated input thin film bias resistors (RN-1, RP-1) to tune and adjust the frequency of the surface acoustic waves to be excited by IDT1 and an output DC biasing voltage $V_{DC'}$ is connected to the output inter digital transducer IDT2 through integrated output thin film bias resistors (RN-1' and RP-1') to tune and adjust frequency of the surface acoustic waves to be received or detected by IDT2. In FIG. 3A, the integrated input and output thin film bias resistors (RN-1, RP-1, RN-1' and RP-1') are integrated with the SAW IDTs and are fabricated on the same substrate in the same fabrication process for the IDTs. Although only three pairs of electrode fingers are shown for IDT1 and IDT2 in FIG. 3A, it is understood that in practical SAW devices, the number of electrode fingers is often much larger in order to achieve the required performance.

The IDT1 (220) comprises an input positive electrode pad (220PM) on an input positive electrode pad doped region (220DP); an input negative electrode pad (220NM) on an input negative electrode pad doped region (220DN); input positive electrode fingers (220P-1, 220P-2, 220P-3) each on an input positive electrode doped region (DP-1, DP-2, DP-3); input negative electrode fingers (220N-1, 220N-2, 220N-3) each on an input negative electrode doped region (DN-1, DN-2, DN-3). A center-to-center distance between an input positive electrode finger and an adjacent input negative electrode finger is controlled to an input pitch (given by b). The input electrode fingers are connected to an electrical signal source (230) to excite surface acoustic waves (240) at a frequency f~v/(2×b), with v being the velocity of the surface acoustic waves.

The output inter digital transducer IDT2 (250) comprises an output positive electrode pad (250PM) on an output positive electrode pad doped region (250DP); an output negative electrode pad (250NM) on an output negative electrode pad doped region (250DN); output positive electrode fingers (250P-1, 250P-2, 250P-3) each on an output positive electrode doped region (DP-1', DP-2', DP-3'); output negative electrode fingers (250N-1, 250N-2, 250N-3) each on an output negative electrode doped region (DN-1', DN-2', DN-3'). A center-to-center distance between an output positive electrode finger and an adjacent output negative electrode finger is controlled to an output pitch (b') which is preferably the same as the input pitch (b), to receive the surface acoustic waves (240) and covert them into an output electrical signal $V_{out}$ across an output resistor R (260).

The input inter digital transducer (220) and output inter digital transducer (250) are kept apart by an IDT center-to-center distance (200D). The Input electrode doped region widths (a) are kept to be substantially equal to half of the input pitch (b) so that a spacing between adjacent input electrode doped regions (c) is also substantially equal to half of the input pitch (b). Similarly, the output electrode doped region width (a'=a) is kept to be substantially equal to half of the output pitch (b'=b) so that a spacing between adjacent output electrode doped regions (c') is also substantially equal to half of the output pitch (b'=b). The input electrode finger width (m) is selected to be the same as the output electrode finger width (m') and the finger widths (m, m') are no more than the electrode doped region widths (a, a').

The value of the input DC biasing voltage $V_{DC}$ is preferably selected to be same as the output DC biasing voltage $V_{DC'}$ to achieve synchronous tuning and adjustment for the frequencies in IDT1 and IDT2. Here, $V_{DC}$ and $V_{DC'}$ could be positive or negative in polarity but with a small magnitude, as long as they can tune and adjust the frequencies of the IDT1 and IDT2. The value of pitch (b or b') is selected during the design and fabrication of the SAW device and the wavelength of surface acoustic waves (240) to be excited and to propagate is: $\lambda=2b=2b'$. The value of $\lambda$ together with the velocity v of the surface acoustic waves thus determine a unique central frequency $f=v/\lambda$ of the excitation, propagating and detection of surface acoustic waves. The tuning of frequency in a tunable SAW IDT is based on the adjustment of mass loading (ML) and adjustment of metallization ratio (MR) associated with the electrode doped regions and electrode fingers. Detail description on the effects of DC bias voltages between the positive electrode doped regions (220P-1, 220P-2, 220P-3) and negative electrode doped regions (220N-1, 220N-2, 220N-3) on mass loading (ML) and metallization ratio (MR) can be found in U.S. patent application Ser. No. 14/756,554.

According to this invention, material of the first piezoelectric layer (210) is selected from a group of piezoelectric semiconductor materials including: $LiNbO_3$, $LiTaO_3$, ZnO, AlN, GaN, AlGaN, $LiTaO_3$, GaAs, AlGaAs and etc. Take one of the well developed piezoelectric substrates $LiNbO_3$ as an example, the velocity of acoustic waves v is about 4,000 msec. To obtain a filter with a central frequency $f_o$=2 GHz, the wavelength of the acoustic wave is λ=(4000 m/sec)/(2× $10^9$/sec)=2×$10^{-4}$ cm. The value of pitch (b or b') is then equal to 1 μm. Assuming that the width of electrode doped regions (a or a') and the space between adjacent electrode doped regions (c or c') are equal, then the electrode doped region width is 0.5 μm. To fabricate SAW IDTs operating at higher frequencies, more advanced lithography tools and more severe processing control will be needed.

The support substrate (210S) are selected from a material group including: $LiNbO_3$, $LiTaO_3$, PZT, AlN, GaN, AlGaN, ZnO, GaAs, AlAs, AlGaAs, $Al_2O_3$, $BaTiO_3$, quartz, $KNbO_3$, Si, sapphire, quartz, glass and plastic. Thickness of the support substrate (210St) is selected by considering mechanical strength, thermal dissipation and acoustic properties requirements. When the material of the first piezoelectric layer (210) is selected to be the same as the support substrate (210S), they can be combined into a single piezoelectric substrate.

The input positive electrode doped regions (DP-1, DP-2, DP-3), the input negative electrode doped regions (DN-1, DN-2, DN-3), the output positive electrode doped regions (DP-1', DP-2', DP-3') and the output negative electrode doped regions (DN-1', DN-2', DN-3') are doped piezoelectric semiconductors, materials of which can be selected from a group including: AlN, GaN, AlGaN, ZnO, GaAs, AlAs, AlGaAs as long as they are piezoelectric semiconductors with sufficient acoustic coupling coefficients and can be doped into n-type and/or p-type conductions. As materials of the input/output positive doped regions and input/output negative doped regions are selected to be a piezoelectric semiconductor having a substantially large energy gap, unwanted leakage current can be kept small when the DC biasing voltage is applied. According to one embodiment of this invention, the thicknesses of the input positive/negative electrode doped regions and the output positive/negative electrode doped regions are preferably controlled to be in a range of 10 to 2000 nm and are more preferably controlled in a range of 20 to 1000 nm, dependent on the operation frequency, the tuning range and the sensitivity of the tuning required.

In FIG. 3A, the input first doping type of the input positive electrode doped regions and the input second doping type of the input negative electrode doped regions are selected to be different. The output first doping type of the output positive electrode doped regions and the output second doping type of the output negative electrode doped regions are also different. The input first doping type and the input second doping type, the output first doping type and the output second doping type can also be selected to be the same. In such cases, DC biasing circuits different from FIG. 3A then will be adopted. The input first doping concentration of the input positive electrode doped regions, the input second doping concentration of the input negative electrode doped regions, the output first doping concentration of the output positive electrode doped regions and the output second doping concentration of the output negative electrode doped regions in the tunable SAW inter digital transducers are preferably to be controlled in the range of $10^{13}$-$10^{20}$ cm$^{-3}$ dependent on the operation frequency and tuning rage required.

In order to facilitate ohmic contacts between the electrode doped regions and the electrode fingers, it is preferable to have a heavily doped surface layer on the input positive/negative electrode doped regions (DP-1, DP-2, DP-3, DN-1, DN-2, DN-3) and the output positive/negative electrode doped regions (DP-1', DP-2', DP-3', DN-1', DN-2', DN-3').

Thicknesses of the $DN^+$ layer and the $DP^+$ layer should be kept small (preferably in the order of 20 nm or less).

Materials for the input positive electrode fingers (220P-1, 220P-2, 220P-3), the input negative electrode fingers (220N-1, 220N-2, 220N-3), the input positive electrode pad (220PM) and the input negative electrode pad (220NM) are selected from a metal group including: Ti, Al, W, Pt, Mo, Cr, Pd, Ta, Cu, Cr, Au, Ni, Ag, Ru, Ir and other metals and their combinations. Materials for the output positive electrode fingers (250P-1, 250P-2, 250P-3), output negative electrode fingers (250N-1, 250N-2, 250N-3), the output positive electrode pad (250PM) and the output negative electrode pad (250NM) are selected from the same group of metals and metal alloys so that they can provide the same electrical performance and can be deposited in the same deposition run.

It is desired to have ohmic contacts between the electrode doped regions and the electrode fingers, therefore material for the first layer of the electrode fingers that contacts the electrode doped regions should be selected with care. Take the IDT1 (220) as an example, when the input positive electrode doped regions are doped to have a p-type conduction, the first layer of the input positive electrode fingers that contact the input positive electrode doped regions should have a work function larger than electron affinity of the piezoelectric semiconducting material of the input positive electrode doped regions. When the input second doping type is opposite to the first doping type, the negative electrode doped regions is doped to an n-type conduction. Therefore, the first layer of the input negative electrode fingers should have a work function close to or less than electron affinity of the piezoelectric semiconducting material of the input negative electrode doped regions.

According one embodiment of this invention, the input positive/negative electrode finger thickness (220P-1t, 220N-1t) are preferably selected to be in a range of 10 to 400 nm, depending on the operation frequency and the frequency tuning range required. In order to decrease the mass loading effect of the input positive/negative electrode fingers and output positive/negative electrode fingers and to increase sensitivities of the frequency tuning, it is preferred to select metals with smaller atomic weights such as Al, Ti as a part of the input electrode fingers and the output electrode fingers. It is also preferable to have a reduced input/output electrode finger thickness (in a range of 20 to 200 nm). Furthermore, a multilayer metal structure involving at least two metal materials may be advantageously adopted to improve the adhesion of the input positive/negative electrode fingers and the output positive/negative electrode fingers and to reduce the contact resistance.

To effectively isolate RF signals and allow application of DC biasing voltages, the resistance values of the integrated input and output thin film bias resistors (RN-1, RP-1, RN-1' and RP-1') are preferably greater than 200Ω, and are more preferably greater than 1000Ω. However, the resistance value R should not be too large in order to keep the RC constant low and to reduce any unwanted switching delay time ($\tau_1=R_1\times C$) of the SAW device. The integrated input and output thin film bias resistors may have different shapes such as rectangle, square, triangle, trapezium, parallelogram etc. Take rectangle shape as an example: the integrated input and output thin film bias resistors may have a bias resistor length $R_L$, a bias resistor width $R_W$, a bias resistor thickness $R_T$. The bias resistor thickness is preferably less than 2 micron and is more preferably less than 0.5 micron to facilitate patterning either by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as such as $RuO_2$, TaN, ZnO, ZnON, InSnO, InSnON, ZnInO, ZnInON, ZnSnO, ZnSnON, $Bi_2Ru_2O_7$, $RuO_2$, $Bi_2Ir_2O_7$, and other semiconductors such as Si as long as the resistance of the integrated thin film bias resistors is preferably greater than 200Ω (or more preferably greater than 1000Ω) and has stable thermal properties. The thin film layers forming the thin film bias resistors may be deposited by vacuum methods such as evaporation, DC sputtering and RF sputtering in a chamber with Ar gas or with a gas mixture of Ar, $O_2$ and/or $N_2$.

Figure 3B:
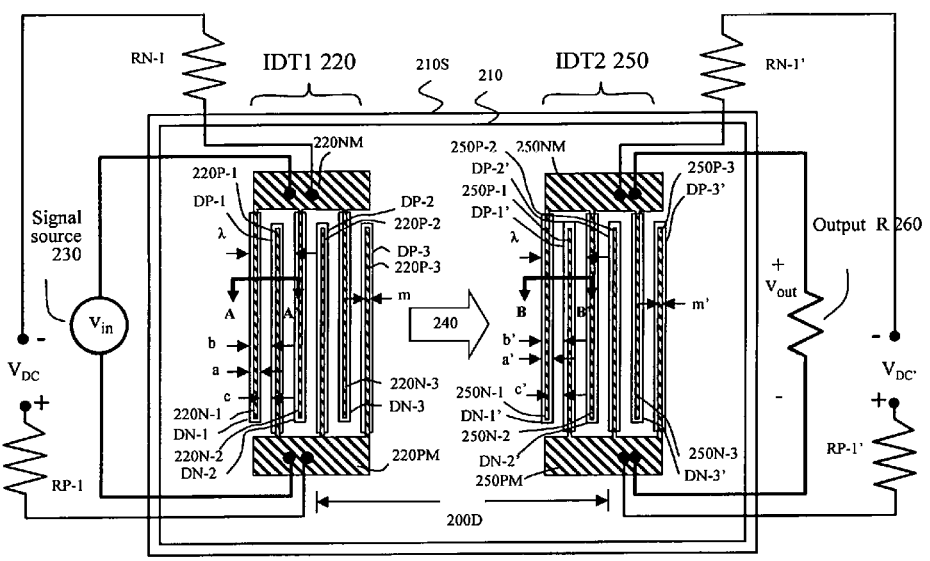
FIG. 3B is a schematic top view showing a tunable SAW filter (300b) wherein input electrode pads and output electrode pads are directly deposited on a first piezoelectric layer (210) according to this invention.

It is noted that the effects of tuning and adjustment of frequency for the SAW structure (300a) shown in FIG. 3A may well be implemented using another SAW structure. FIG. 3B shows a schematic top view of a tunable and adjustable SAW filter (300b) having an input inter digital transducer IDT1 (220) and an output inter digital transducer IDT2 (250) on a first piezoelectric layer (210). The SAW filter (200b) comprises an input negative electrode pad (220NM), an input positive electrode pad (220PM), an output negative electrode pad (250NM) and an output positive electrode pad (250PM) which are directly deposited on the first piezoelectric layer (210). Other elements and components in FIG. 3B are the same as those in FIG. 3A with the exception of the missing input electrode pad doped regions (220DP, 220DN) and the output electrode pad doped regions (250DP, 250DN).

Figure 3C:
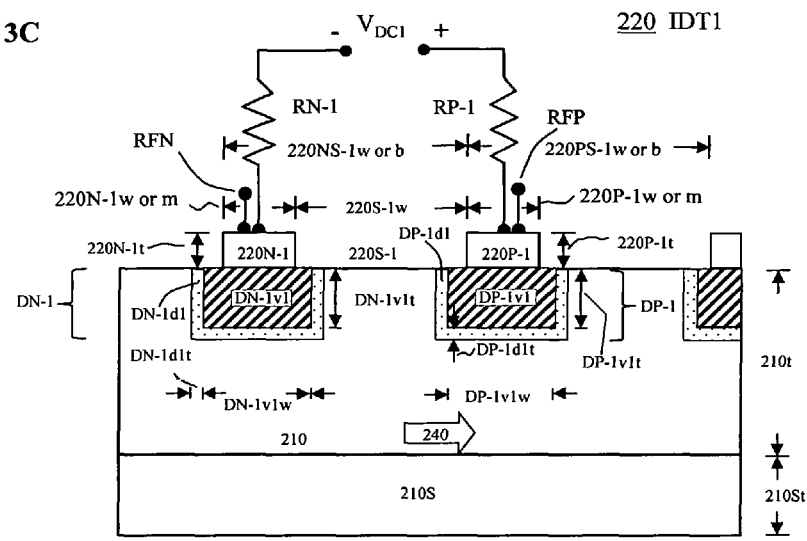
FIG. 3C is a schematic cross-sectional diagram taken along line A-A' in the tunable SAW filter (300a) in FIG. 3A, showing a part of the input inter digital transducer IDT1 having an embedded input positive electrode doped neutral region and an embedded input negative electrode doped neutral region with opposite doping types, wherein a first input DC biasing voltage $V_{DC1}$ is applied through integrated input thin film bias resistors (RN-1 and RP-1) to the positive and negative electrode fingers.
Figure 3D:
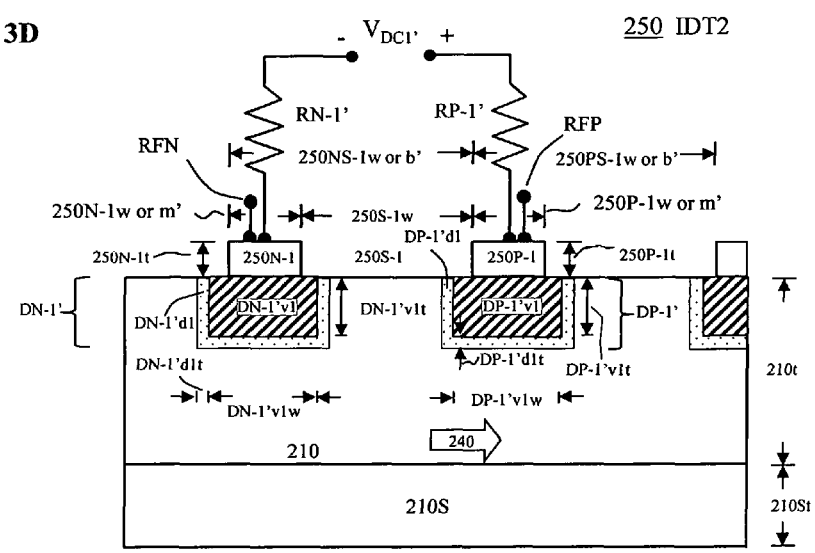
FIG. 3D is a schematic cross-sectional view taken along line B-B' in the tunable SAW filter (300a) in FIG. 3A, showing a part of the output inter digital transducer IDT2 with an embedded output positive electrode doped neutral region and an embedded output negative electrode doped neutral region with opposite doping types, wherein a first output DC biasing voltage $V_{DC1}$ is applied to the positive and negative electrode fingers through integrated output thin film bias resistors RN-1' and RP-1'.

IDTs with Embedded Electrode Doped Regions of Opposite Doping Types:

Schematic cross sectional views of the IDT1 (220) and the IDT2 (250), taken along lines A-A' and B-B' respectively in FIG. 3A, are shown in FIGS. 3C and 3D for IDT1 (220) with embedded input positive/negative electrode doped regions and IDT2 (250) with embedded output positive/negative electrode doped regions and with opposite doping types for the positive electrode doped regions and the negative electrode doped regions.

FIG. 3C shows a part of the IDT1 (220) with embedded input electrode doped regions, taken along the line A-A' in (300a, FIG. 3A). The IDT1 (220) is on a first piezoelectric layer (210) with a first piezoelectric layer thickness (210t) which is on a support substrate (210S) having a support substrate thickness (210St). An input positive electrode doped region (DP-1, see FIG. 3A) with an input first doping type (either p-type or n-type) and a first doping concentration ($N_A$ for p-type or $N_D$ for n-type) is embedded in the first piezoelectric layer (210). An input negative electrode doped region (DN-1, FIG. 3A) with an input second doping type and a second doping concentration ($N_D$ or $N_A$) is also embedded in the first piezoelectric layer (210). In this structure, the input second doping type is opposite to the input first doping type. The first and the second doping concentrations of the input positive and negative electrode doped regions in the tunable SAW inter digital transducer IDT1 are preferably controlled to be in the range of $10^{13}$-$10^{20}$ cm$^{-3}$, dependent on the operation frequency and tuning rage required.

In FIG. 3C, the input positive electrode doped region (DP-1) consists of two parts: an input positive electrode doped neutral region (DP-1v1) and an input positive electrode depletion region (DP-1d1). The input negative electrode doped region (DN-1) also has two parts: an input negative electrode doped neutral region (DN-1v1) and an input negative electrode depletion region (DN-1d1). The input positive electrode depletion region (DP-1d1) has an input positive electrode depletion region thickness (DP-1d1t) and the input negative electrode depletion region (DN-1d1) has an input negative electrode depletion region thickness (DN-1d1t). The input positive electrode doped neutral region (DP-1v1) has an input positive electrode doped neutral region thickness (DP-1v1t) and an input positive electrode doped neutral region width (DP-1v1w) and the input negative electrode doped neutral region (DN-1v1) has an input negative electrode doped neutral region thickness (DN-1v1t) and an input negative electrode doped neutral region width (DN-1v1w).

An input positive electrode finger (220P-1) with an input positive electrode finger width (220P-1w or m) and an input positive electrode finger thickness (220P-1t) is on top of and is aligned to the input positive electrode doped region (DP-1). An input negative electrode finger (220N-1) with an input negative electrode finger width (220N-1w or m) and an input negative electrode finger thickness (220N-1t) is on top of and is aligned to the input negative electrode doped region (DN-1). The input positive electrode finger (220P-1) makes an ohmic contact to the input positive electrode doped neutral region (DP-1v1) and the input negative electrode finger (220N-1) makes an ohmic contact to the input negative electrode doped neutral region (DN-1v1). The space between the input positive electrode finger (220P-1) and the input negative electrode finger (220N-1) defines an input electrode spacing region (220S-1) with an input electrode spacing region width (220S-1w). The pitch (220NS-1w or b) is equal to the sum of the input negative electrode finger width (m) and the input electrode spacing region width (220S-1w) and it is also equal to (220PS-1w). An first input DC biasing voltage $V_{DC1}$ is applied through integrated input thin film bias resistors (RP-1, RN-1) to the input positive electrode finger (220P-1) and the input negative electrode finger (220N-1). RF signals are applied through a positive RF contact (RFP) and a negative RF contact (RFN). The integrated input thin film bias resistors (RP-1, RN-1) prevent leakage of RF signals to the DC bias circuit.

It is noted that due to the presence of the input positive/negative electrode depletion regions (DP-1d1, DN-1d1), the input positive/negative electrode doped neutral regions (DP-1v1, DN-1v1) have a reduced size as compared with that of the input positive/negative electrode doped regions devoid of the depletion regions. In IDT1, the input negative electrode depletion region thickness (DN-1d1t) is controlled to be substantially the same in magnitude as the input positive electrode depletion region thickness (DP-1d1t).

The polarity and magnitude of the first input DC biasing voltage $V_{DC1}$ controls and varies the thickness of the input positive electrode depletion region (DP-1d1t) and that of the input negative electrode depletion region (DN-1d1t), therefore it controls and varies the sizes of the input positive/negative electrode doped neutral regions (DP-1v1, DN-1v1) and the loading mass associated with the input positive electrode finger (220P-1) and the input negative electrode finger (220N-1). Here, $V_{DC1}$ could be positive or negative in polarity with a small magnitude, provided that it can control and vary the size of the input positive/negative electrode doped neutral regions to achieve tuning of the frequency in the IDT1.

FIG. 3D shows a part of the output IDT2 (250) with embedded input electrode doped regions, taken along the line B-B' in (300a, FIG. 3A). The IDT2 (250) comprises a first piezoelectric layer (210) with a first piezoelectric layer thickness (210t) and a support substrate (210S) having a support substrate thickness (210St). An output positive electrode doped region (DP-1', see FIG. 3A) with an output first doping type (p-type or n-type) and a first doping concentration ($N_A$ for p-type or $N_D$ for n-type) is embedded in the first piezoelectric layer (210). An output negative electrode doped region (DN-1', see FIG. 3A) with an output second doping type and a second doping concentration ($N_D$ or $N_A$) is also embedded in the first piezoelectric layer (210), wherein the output second doping type is opposite to the output first doping type. The first and the second doping concentrations of the output positive and negative electrode doped regions in the tunable SAW inter digital transducers are preferably to be controlled in the range of $10^{13}$-$10^{20}$ cm$^{-3}$ dependent on the operation frequency and tuning rage required.

In FIG. 3D, the output positive electrode doped region (DP-1') includes two parts: an output positive electrode doped neutral region (DP-1'$v$1) and an output positive electrode depletion region (DP-1'$d$1). The output negative electrode doped region (DN-1') also has two parts: an output negative electrode doped neutral region (DN-1'$v$1) and an output negative electrode depletion region (DN-1'$d$1). The output positive electrode depletion region (DP-1'$d$1) has an output positive electrode depletion region thickness (DP-1'$d$1$t$) and the output negative electrode depletion region (DN-1'$d$1) has an output negative electrode depletion region thickness (DN-1'$d$1$t$). The output positive electrode doped neutral region (DP-1'$v$1) has an output positive electrode doped neutral region thickness (DP-1'$v$1$t$) and an output positive electrode doped neutral region width (DP-1'$v$1$w$) and the output negative electrode doped neutral region (DN-1'$v$1) has an output negative electrode doped neutral region thickness (DN-1'$v$1$t$) and an output negative electrode doped neutral region width (DN-1'$v$1$w$).

An output positive electrode finger (250P-1) with an output positive electrode finger width (250P-1$w$ or $m$') and an output positive electrode finger thickness (250P-1$t$) is on top of and is aligned to the output positive electrode doped region (DP-1'). An output negative electrode finger (250N-1) with an output negative electrode finger width (250N-1$w$ or $m$') and an output negative electrode finger thickness (250N-1$t$) is on top of and is aligned to the output negative electrode doped region (DN-1'). The output positive electrode finger (250P-1) makes an ohmic contact to the output positive electrode doped neutral region (DP-1'$v$1) and the output negative electrode finger (250N-1) makes an ohmic contact to the output negative electrode doped neutral region (DN-1'$v$1). The space between the output positive electrode finger (250P-1) and the output negative electrode finger (250N-1) defines an output electrode spacing region (250S-1) with an output electrode spacing region width (250S-1$w$). The pitch (250PS-1$w$ or $b$') is equal to the sum (250NS-1$w$) of the output negative electrode finger width ($m$') and the output electrode spacing region width (250S-1$w$) and is also equal to (250NS-1$w$). An first output DC biasing voltage $V_{DC1'}$ is applied through integrated output thin film bias resistors (RP-1', RN-1') and RF signals are obtained through a positive RF contact (RFP) and a negative RF contact (RFN). The integrated output thin film bias resistors (RP-1', RN-1') are used to prevent leakage of RF signals into the DC bias circuit.

It is noted that due to the presence of the output positive/negative electrode depletion regions (DP-1'$d$1, DN-1'$d$1), the output positive/negative electrode doped neutral regions (DP-1'$v$1, DN-1'$v$1) have a reduced size as compared with that of the output positive/negative electrode doped regions devoid of the depletion regions. In IDT2, the output negative electrode depletion region thickness (DN-1'$d$1$t$) is controlled to be substantially the same in magnitude as the output positive electrode depletion region thickness (DP-1'$d$1$t$).

The polarity and magnitude of the first output DC biasing voltage $V_{DC1'}$ controls and varies the thicknesses (DP-1'$d$1$t$, DN-1'$d$1$t$) of the output positive electrode depletion region (DP-1'$d$1) and the output negative electrode depletion region (DN-1'$d$1), therefore it controls and varies the sizes of the output positive/negative electrode doped neutral regions (DP-1'$v$1, DN-1'$v$1) and the loading mass associated with the output positive electrode finger (250P-1) and the output negative electrode finger (250N-1). Here, $V_{DC1'}$ could be positive or negative in polarity but with a small magnitude, as long as it can control and vary the size of the output positive depletion regions and the output negative depletion regions to achieve tuning of the frequency of the IDT2.

Mass Loading and Metallization Ratio

In an IDT with embedded electrode doped regions and without any depletion regions formed in the electrode doped regions, the entire electrode doped regions act as conductors and the mass loading is at its maximum value and the metallization ratio is also at its maximum value. Under such conditions, the frequency of the surface acoustic waves to be excited or to be received is called the basic frequency $f_o$ which is at its maximum value. As the positive and negative electrode doped neutral regions are neutral piezoelectric semiconductors which are electrically conducting, when an input RF signal source is applied across the positive electrode fingers and the negative electrode fingers, electric fields due to the input RF signals do not occur in these conducting negative/positive electrode doped neutral regions.

When a DC biasing voltage is applied to an IDT to increase the size of the depletion regions formed in the positive/negative electrode doped regions, it causes a decrease in sizes (both width and thickness) of the positive and negative doped neutral regions. The reduced size in the positive electrode doped neutral region forms a part of reduced loading mass with the positive electrode finger and the reduced size in the negative electrode doped neutral region forms another part of reduced loading mass with the negative electrode finger, so that a shift in the frequency of surface acoustic waves to be excited or to be received from the basic frequency $f_o$ is affected. The amount of frequency difference or frequency shift due to the reduced loading mass is determined by the total reduced mass associated with the negative electrode finger and the negative electrode doped neutral region (per unit area) and the total reduced mass associated with the positive electrode finger and the positive electrode doped neutral region (per unit area).

In FIG. 3C, due to the presence of the input positive/negative electrode depletion regions (DP-1$d$1, DN-1$d$1), the loading mass associated with the input positive electrode finger (220P-1) which is the sum of mass of the input positive electrode doped neutral region (DP-1$v$1) and mass of the input positive electrode finger (220P-1) will decrease from the highest value when there is no depletion regions. Whereas the loading mass associated with the input negative electrode finger (220N-1) which is equal to the sum of mass of the input negative electrode doped neutral region (DN-1$v$1) and mass of the input negative electrode finger (220N-1) also deceases from the highest value when there is no depletion regions. The decrease in the value of the loading mass will cause an increase in the velocity of the surface acoustic waves (240) and therefore an increase in the frequency of the surface acoustic waves (240) from the basic frequency $f_o$ to a new value $f_1$. Here, $f_o$ is the frequency when there is no input positive and negative electrode depletion regions. Therefore, when the total mass of input positive electrode fingers, negative electrode fingers and electrode doped neutral regions is decreased by a DC biasing voltage, there is a decrease in the mass loading effect and hence a mass loading frequency difference $\Delta f_{ML1}=f_1-f_0$.

Metallization ratio MR is defined as the ratio between the input positive/negative electrode doped neutral region width to the pitch value b. In FIG. 3C, MR=(DP-1$v$1$w$)/(220PS-1$w$)=(DP-1$v$1$w$)/b=(DN-1$v$1$w$)/(220NS-1$w$)=(DN-1$v$1$w$)/b. It is noted that MR value is reduced due to an increase in the size of the input positive/negative electrode depletion regions (DP-1$d$1, DN-1$d$1). With a fixed mass of loading ML, when the MR value is decreased, the velocity v of the surface acoustic waves (240) increases and the frequency of the surface acoustic waves increases. The frequency difference due to the metallization ratio change is given by $\Delta f_{MR}$. Therefore, due to an increase in the size of the input positive/negative electrode doped depletion regions caused by the first input DC biasing voltage $V_{DC1}$, MR decreases and the frequency of the surface acoustic waves increases.

According to one embodiment of the invention, the metallization ratio MR of an tunable input IDT is adjusted and controlled by adjusting and controlling widths (DP-1$v$1$w$, DN-1$v$1$w$) of the input electrode doped neutral regions (DP-1$v$1, DN-1$v$1) by the input DC biasing voltage. Whereas the mass loading ML is adjusted and controlled by adjusting and controlling the thickness and the width (DP-1$v$1$t$, DP-1$v$1$w$, DN-1$v$1$t$, DN-1$v$1$w$) of the input electrode doped neutral regions (DP-1$v$1, DN-1$v$1) by the input DC biasing voltage. Similarly, the metallization ratio MR of an tunable output IDT is adjusted and controlled by adjusting and controlling widths (DP-1'$v$1$w$, DN-1'$v$1$w$) of the output electrode doped neutral regions (DP-1'$v$1, DN-1'$v$1) by the output DC biasing voltage. The mass loading ML is adjusted and controlled by adjusting and controlling the thickness and the width (DP-1'$v$1$t$, DP-1'$v$1$w$, DN-1'$v$1$t$, DN-1'$v$1$w$) of the output electrode doped neutral regions (DP-1'$v$1, DN-1'$v$1) by the output DC biasing voltage. Hence, in the present SAW transducers, SAW oscillators, SAW duplexer and SAW filters, the frequency of the IDTs is tunable and adjustable by applying and varying the DC biasing voltage.

To effectively isolate RF signals and allow application of the DC biasing voltage, the resistance values R of the integrated input and output thin film bias resistors (RN-1, RP-1, RN-1' and RP-1') are preferably greater than 200Ω, and more preferably greater than 1000Ω. However, R should not be too large in order to keep a low RC constant and to reduce unwanted large switching delay time $\tau_1=R_1 \times C$ of the SAW device.

The integrated input and output thin film bias resistors may have different shapes such as rectangle, square, triangle, trapezium, parallelogram etc. Take rectangle shape as an example: the integrated input and output thin film bias resistors may have a bias resistor length $R_L$, a bias resistor width $R_W$, a bias resistor thickness $R_T$. The bias resistor thickness is preferably less than 2 micron and is more preferably less than 0.5 micron to facilitate patterning by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as $RuO_2$, TaN, ZnO, ZnON, InSnO, InSnON, ZnInO, ZnInON, ZnSnO, ZnSnON, $Bi_2Ru_2O_7$, $RuO_2$, $Bi_2Ir_2O_7$ and other semiconductors such as Si, as long as the resistance of the thin film bias resistors R is greater than 200Ω (or greater than 1000Ω) and has stable thermal properties. The thin film layers forming the integrated thin film bias resistors may be deposited by vacuum methods such as evaporation, DC sputtering and RF sputtering in a chamber with Ar gas or with a gas mixture of Ar, $O_2$ and/or $N_2$.

In order to facilitate ohmic contacts, it is preferable to have a heavily doped surface layer on the embedded input and output positive/negative electrode doped regions. Thicknesses of the heavily doped surface layers should be kept small (in the order of 20 nm or less).

Figure 3E:
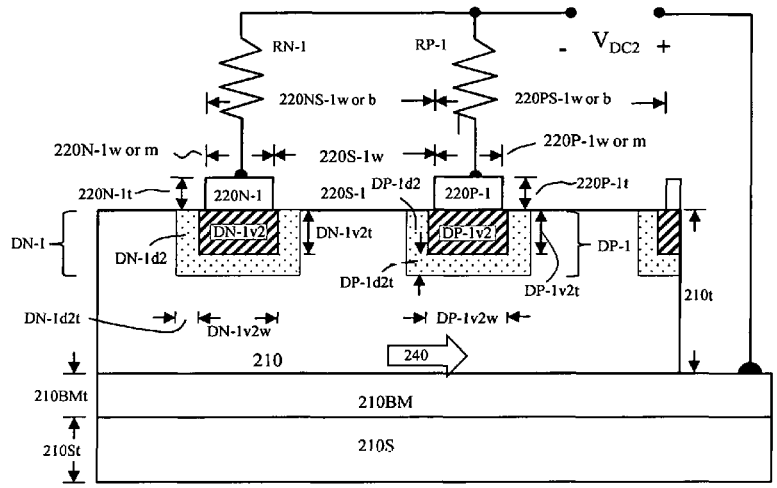
FIG. 3E is a schematic cross-sectional view taken along line A-A' in the tunable SAW filter (300a, FIG. 3A), showing a part of the IDT1 with embedded input positive and negative electrode doped neutral regions having the same doping type. The embedded electrode doped neutral regions are connected together and a second input DC biasing voltage $V_{DC2}$ is applied between the electrode fingers and the bottom electrode layer through integrated input thin film bias resistors (RN-1, RP-1) to tune frequency of the IDT1.
Figure 3F:
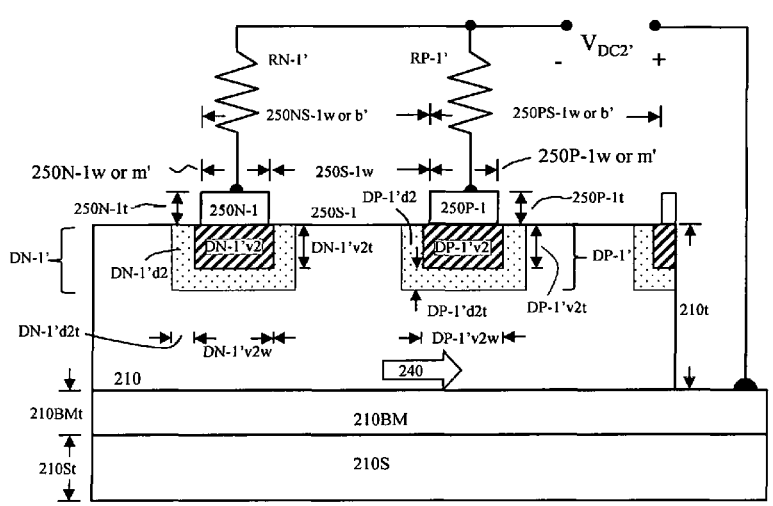
FIG. 3F is a schematic cross-sectional view taken along line B-B' in the tunable SAW filter (300a, FIG. 3A), showing a part of the IDT2 with embedded output positive and negative electrode doped neutral regions having the same doping type. The embedded electrode doped neutral regions are connected together and a second output DC biasing voltage $V_{DC2'}$ is applied between the electrode fingers and the bottom electrode layer through integrated output thin film bias resistors (RN-1', RP-1') for tuning the frequency of the IDT2.

IDTs with Embedded Electrode Doped Regions of the Same Doping Type:

Schematic cross sectional views of the IDT1 (220) and the IDT2 (250), taken along lines A-A' and B-B' respectively are shown in FIGS. 3E and 3F. The IDT1 has embedded input positive/negative electrode doped regions and the IDT2 has embedded output positive/negative electrode doped regions, wherein the positive electrode doped regions and the negative electrode doped regions are doped to have the same conduction type.

FIG. 3E is a schematic cross-sectional view of a part of IDT1 (220) in a tunable and adjustable SAW filter similar to the IDT1 (220) shown in FIG. 3C, showing two adjacent input electrode fingers (220N-1, 220P-1) on embedded input electrode doped neutral regions (DN-1$v$2, DP-1$v$2). A bottom electrode layer (210BM) having a bottom layer thickness (210BMt) is sandwiched between the support substrate (210S) and the first piezoelectric layer (210) according to this invention. The input positive electrode doped region (DP-1) contains two parts: an input positive electrode doped neutral region (DP-1$v$2) and an input positive electrode depletion region (DP-1$d$2). The input negative electrode doped region (DN-1) also has two parts: an input negative electrode doped neutral region (DN-1$v$2) and an input negative electrode depletion region (DN-1$d$2). The input positive electrode doped neutral region (DP-1$v$2) has an input positive electrode doped neutral region thickness (DP-1$v$2$t$) and an input positive electrode doped neutral region width (DP-1$v$2$w$) and the input negative electrode doped neutral region (DN-1$v$2) has an input negative electrode doped neutral region thickness (DN-1$v$2$t$) and an input negative electrode doped neutral region width (DN-1$v$2$w$).

It should be emphasized that in this structure, the input first doping type of the input positive electrode doped neutral region (DP-1$v$2) and the input second doping type of the input negative electrode doped neutral region (DN-1$v$2) are selected to be the same (either p-type or n-type). The first doping concentration of the input positive electrode doped neutral region (DP-1$v$2) and the second doping concentration of the input negative electrode doped region (DN-1$v$2) are selected to be substantially the same and are preferably to be in the range of $10^{13}$-$10^{20}$ cm$^{-3}$, dependent on the operation frequency and tuning range required. The input positive electrode finger (220P-1) with an input positive electrode forger thickness (220P-1) makes an ohmic contact to the input positive electrode doped neutral region (DP-1$v$2) and the input negative electrode finger (220N-1) with an input negative electrode finger thickness (220N-1) makes an ohmic contact to the input negative electrode doped neutral region (DN-1$v$2). In order to facilitate ohmic contacts, it is preferable to have a heavily doped surface layer on the embedded input positive/negative electrode doped regions. Thicknesses of the heavily doped surface layers should be kept small (in the order of 20 nm or less).

The space between the input positive electrode finger (220P-1) and the input negative electrode finger (220N-1) defines an input electrode spacing region (220S-1) with an input electrode spacing region width (220S-1$w$). The pitch (220NS-1w or b) is equal to the sum of the input negative electrode finger width (m) and the input electrode spacing region width (220S-1w) and it is also equal to (220PS-1w).

An first input DC biasing voltage $V_{DC1}$ is applied through integrated input thin film bias resistors (RP-1, RN-1) to the input positive electrode finger (220P-1) and the input negative electrode finger (220N-1). RF signals are applied through a positive RF contact (RFP) and a negative RF contact (RFN). The integrated input thin film bias resistors (RP-1, RN-1) prevent leakage of RF signals to the DC bias circuit.

As a result of the same doping type of the input positive and negative electrode doped neutral regions, the input electrode fingers (220P-1) and (220N-1) are connected together through integrated input thin film bias resistors (RP-1, RN-1) to a negative terminal of the input DC biasing voltage source, whereas the bottom electrode layer (210BM) of a thickness (210BMt) is connected to a positive terminal of the DC biasing voltage source, so that a second input DC biasing voltage $V_{DC2}$ is applied between the input electrode fingers (220P-1, 220N-1) and the bottom electrode layer (210BM). RF signals are applied between a positive RF contact (RFP) and a negative RF contact (RFN). Although the doping types and the biasing arrangement for IDT1 in FIG. 3E are different from IDT1 shown in FIG. 3C, the elements in FIG. 3E are marked the same as the IDT1 in FIG. 3C for convenience. The integrated input thin film bias resistors (RP-1, RN-1) prevent leakage of RF signals to the DC bias circuit.

In FIG. 3E, the second input biasing DC voltage $V_{DC2}$ could be positive or negative in polarity. The value of the $V_{DC2}$ is regulated and the polarity of it is adjusted in order to achieve control and adjustment for the thickness (DP-1d2t, DN-1d2t) of the input positive/negative electrode depletion regions (DP-1d2, DN-1d2), the thickness and width (DP-1v2t, DP-1v2w, DN-1v2t, DN-1v2w) of the input positive/negative electrode doped neutral regions (DP-1v2, DN-1v2). This in turn regulates and changes the input positive electrode loading mass (the sum of mass of (DP-1v2) and mass of (220P-1)) and the input negative electrode loading mass (the sum of mass of (DN-1v2) and mass of (220N-1)) in IDT1 to achieve a mass loading frequency difference $\Delta f_{ML}$ (from the basic frequency value $f_o$) for the surface acoustic waves (240) to be excited. It also adjusts and changes the metallization ratio associate with the input positive electrode doped neutral region and the input negative electrode doped neutral region to achieve a frequency difference $\Delta f_{MR}$.

When the input positive/negative electrode depletion region thicknesses (DP-1d2t, DN-1d2t) are increased by an increase in the magnitude of the reverse DC biasing voltage $V_{DC2}$, the frequency of the surface acoustic waves will increase due to a decrease in the loading mass of the input positive/negative electrodes and a decrease in the metallization ratios. When the input positive/negative electrode depletion region thickness (DP-1d2t, DN-1d2t) are decreased by a decrease in the magnitude of the reverse DC biasing voltage $V_{DC2}$ or by reversing the polarity of $V_{DC2}$ to forward biasing, the frequency of surface acoustic waves will decrease due to the increase in the input positive/negative electrode loading masses ML (as a result of increases in the thicknesses and widths of the input negative and positive electrode doped neutral regions) and the increase in the metallization ratios MR (as a result of increases in widths of the input negative and positive electrode doped neutral regions). The mass loading frequency difference $\Delta f_{ML}$ combined with the metallization ratio frequency difference $\Delta f_{MR}$ will produce the overall frequency difference $\Delta f_T$ from the basic frequency $f_o$.

FIG. 3F shows a schematic cross-sectional view of a part of IDT2 (250) in a tunable and adjustable SAW filter similar to the IDT2 (250) shown in FIG. 3D, showing two adjacent output electrode fingers (250N-1, 250P-1) on embedded electrode doped neutral regions (DN-1'v2, DP-1'v2). A bottom electrode layer (210BM) having a bottom electrode layer thickness (210BMt) is sandwiched between the support substrate (210S) and the first piezoelectric layer (210). In FIG. 3F, the output positive electrode doped region (DP-1') contains two parts: an output positive electrode doped neutral region (DP-1'v2) and an output positive electrode depletion region (DP-1'd2). The output negative electrode doped region (DN-1') also contains two parts: an output negative electrode doped neutral region (DN-1'v2) and an output negative electrode depletion region (DN-1'd2). The output positive electrode doped neutral region (DP-1'v2) has an output positive electrode doped neutral region thickness (DP-1'v2t) and an output positive electrode doped neutral region width (DP-1'v2w) and the output negative electrode doped neutral region (DN-1'v2) has an output negative electrode doped neutral region thickness (DN-1'v2t) and an output negative electrode doped neutral region width (DN-1'v2w).

In this structure, the output first doping type of the positive electrode doped neutral region (DP-1'v2) and the output second doping type of the negative electrode doped neutral region (DN-1'v2) are selected to be the same (either p-type or n-type). The first doping concentration of the positive electrode doped neutral region (DP-1'v2) and the second doping concentration of the negative electrode doped neutral region (DN-1'v2) are selected to be substantially the same and are preferably to be in the range of $10^{13}$-$10^{20}$ cm$^{-3}$ dependent on the operation frequency and tuning rage required. The output positive electrode finger (250P-1) makes an ohmic contact to the output positive electrode doped neutral region (DP-1'v2) and the output negative electrode finger (250N-1) makes an ohmic contact to the output negative electrode doped neutral region (DN-1'v2). In order to facilitate ohmic contacts, it is preferable to have a heavily doped surface layer on the embedded output positive/negative electrode doped regions (DP-1', DN-1'). Thicknesses of the heavily doped surface layers should be kept small (in the order of 20 nm or less).

The space between the output positive electrode finger (250P-1) and the output negative electrode finger (250N-1) defines an output electrode spacing region (250S-1) with an output electrode spacing region width (250S-1w). The pitch (250NS-1w or b') is equal to the sum of the output positive/negative electrode finger width (m') and the output electrode spacing region width (250S-1w) and it is also equal to (250PS-1w).

Due to the same doping type of the output positive and negative electrode doped neutral regions (DP-1'v2, DN-1'v2), the output electrode fingers (250P-1) and (250N-1) are connected together through integrated output thin film bias resistors (RP-1', RN-1') to a negative terminal of an output DC biasing voltage source, whereas the bottom electrode layer (210BM) of a thickness (210BMt) is connected to a positive terminal of the DC biasing voltage source, so that a second output DC biasing voltage $V_{DC2'}$ is applied between the output electrode fingers (250P-1, 250N-1) and the bottom electrode layer (210BM). RF signals are received between a positive RF contact (RFP, not shown) and a negative RF contact (RFN, not shown). Although the doping types and the biasing arrangement for IDT2 in FIG.

3F are different from IDT2 (250) shown in FIG. 3D, the elements in FIG. 3F are marked the same way as the IDT2 in FIG. 3D for convenience. The integrated output thin film bias resistors (RP-1', RN-1') prevent leakage of RF signals to the DC bias circuit.

In FIG. 3E, the second output DC voltage $V_{DC2'}$ could be positive or negative in polarity. The value of the $V_{DC2'}$ is regulated and the polarity of it is adjusted in order to achieve control and adjustment for the thickness (DP-1'$d2t$, DN-1'$d2t$) of the output positive/negative electrode depletion regions (DP-1'$d2$, DN-1'$d2$) and the thickness and width (DP-1'$v2t$, DP-1'$v2w$, DN-1'$v2t$, DN-1'$v2w$) of the output positive/negative electrode doped neutral regions (DP-1'$v2$, DN-1'$v2$). This in turn regulates and changes the output positive electrode loading mass (the sum of mass of (DP-1'$v2$) and mass of (250P-1)) and the output negative electrode loading mass (the sum of mass of (DN-1'$v2$) and mass of (250N-1)) in IDT2 to achieve a mass loading frequency difference $\Delta f_{ML}$ (from the basic frequency value $f_o$) for the surface acoustic waves (240) to be received. It also adjusts and changes the metallization ratio associate with the output positive electrode doped neutral region and the output negative electrode doped region to achieve a frequency difference $\Delta f_{MR}$.

When the output positive/negative electrode depletion region thicknesses (DP-1'$d2t$, DN-1'$d2t$) are increased by an increase in the magnitude of the reverse DC biasing voltage $V_{DC2'}$, the frequency of the surface acoustic waves will increase due to a decreases in loading mass of the output positive/negative electrodes and a decrease in the metallization ratios. When the output positive/negative electrode depletion region thickness (DP-1'$d2t$, DN-1'$d2t$) are decreased by a decrease in the magnitude of the reverse DC biasing voltage $V_{DC2'}$ or by reversing the polarity of $V_{DC2'}$ to forward biasing, the frequency of surface acoustic waves will decrease due to the increase in the output positive/negative electrode loading masses (as a result of increases in the thicknesses and widths of the output positive/negative electrode doped neutral regions) and the increase in the metallization ratios MR (as a result of increases in the widths of the output positive/negative electrode doped neutral regions). The mass loading frequency difference $\Delta f_{ML}$ combined with the metallization ratio frequency difference $\Delta f_{MR}$ will produce the overall frequency difference $\Delta f_T$ from the basic frequency $f_o$.

To effectively isolate RF signals and allow application of DC biasing voltages, the resistance values R of the integrated input and output thin film bias resistors (RN-1, RP-1, RN-1' and RP-1') are preferably greater than 200Ω, or more preferably greater than 1000Ω. However, R should not be too large in order to keep a low RC constant and to reduce unwanted switching delay time of the SAW device.

The input and output thin film bias resistors may have different shapes such as rectangle, square, triangle, trapezium and parallelogram etc. Take rectangle shape as an example: the integrated input and output thin film bias resistors may have a bias resistor length $R_L$, a bias resistor width $R_W$ and a bias resistor thickness $R_T$. The bias resistor thickness is preferably less than 2 micron and is more preferably less than 0.5 micron to facilitate patterning by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as $RuO_2$, TaN, ZnO, ZnON, InSnO, InSnON, ZnInO, ZnInON, ZnSnO, ZnSnON, $Bi_2Ru_2O_7$, $RuO_2$, $Bi_2Ir_2O_7$, and other semiconductors such as Si, as long as the resistance of the integrated thin film bias resistors R is greater than 200Ω (or greater than 1000Ω) and has stable thermal properties. The thin film layers forming the integrated thin film bias resistors may be deposited by vacuum methods such as evaporation, DC sputtering and RF sputtering in a vacuum chamber with Ar gas or a gas mixture of Ar, $O_2$ and/or $N_2$. Materials of the bottom electrode layer (210BM) may be selected from a group of metals and doped semiconductors, preferably doped piezoelectric semiconductors in the group of: Ti, Al, W, Pt, Mo, Cr, Pd, Ta, Cu, Cr, Au, Ni, Ag, Ru, Ir, MN, GaN, AlGaN, ZnO, GaAs, AlAs, AlGaAs and their combinations.

IDTs with Elevated Electrode Doped Regions of Opposite Doping Types:

In order to increase the mass loading effects ($\Delta f_{ML}$) and decrease the metallization ratio effects ($\Delta f_{MR}$), SAW structures with elevated electrode doped regions, as shown in FIGS. 3G-3J are provided in this invention.

Figure 3G:
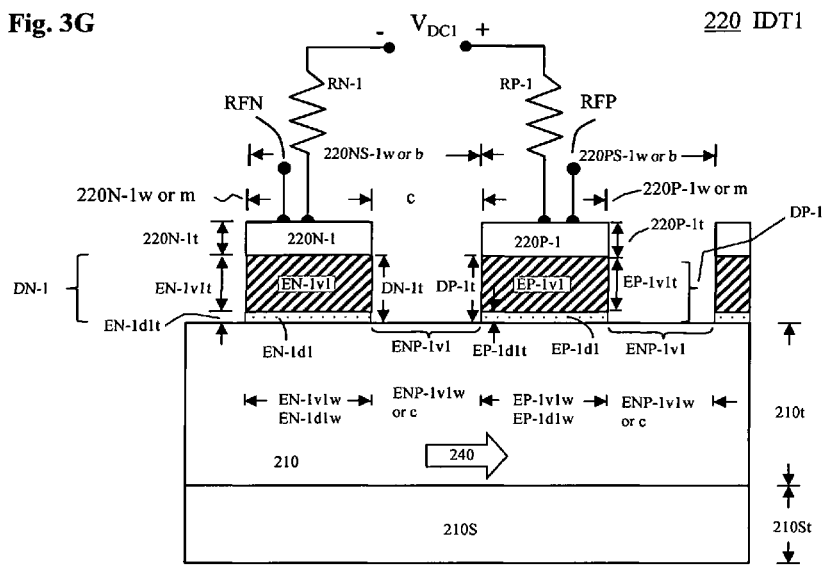
FIG. 3G is a schematic cross-sectional diagram taken along line A-A' in the tunable SAW filter (300a, FIG. 3A), showing a part of the IDT1 with an elevated input positive electrode doped neutral region and an elevated input negative electrode doped neutral region with opposite doping types, wherein a first input DC biasing voltage $V_{DC1}$ is applied between the input positive electrode finger and the input negative electrode finger through integrated input thin film bias resistors (RN-1, RP-1) for tuning the frequency of the IDT1.

FIG. 3G is a schematic cross-sectional view of the tunable SAW filter (300$a$, FIG. 3A), taken along line A-A', showing a part of the input inter digital transducer IDT1 (220). An elevated input positive electrode doped region (DP-1) and an elevated input negative electrode doped region (DN-1) are deposited on a top surface of the first piezoelectric layer (210) which is on a support substrate (210S).

The elevated input positive electrode doped region (DP-1) of a thickness (DP-1$t$) consists of two parts: an elevated input positive electrode doped neutral region (EP-1$v$1) having a thickness (EP-1$v$1$t$) and a width (EP-1$v$1$w$); and an elevated input positive electrode depletion region (EP-1$d$1) having a thickness (EP-1$d$1$t$) and a width (EP-1$d$1$w$). The elevated input negative electrode doped region (DN-1) of a thickness (DN-1$t$) also has two parts: an elevated input negative electrode doped neutral region (EN-1$v$1) having a thickness (EN-1$v$1$t$) and a width (EN-1$v$1$w$); and an elevated input negative electrode depletion region (EN-1$d$1) having a thickness (EN-1$d$1$t$) and a width (EN-1$d$1$w$). The elevated input positive electrode doped neutral region (EP-1$v$1) has an input first doping type (p-type or n-type) and the elevated input negative electrode doped neutral region (EN-1$v$1) has an input second doping type which is opposite to the input first doping type.

An input positive electrode finger (220P-1) with an input positive electrode finger width (220P-1$w$ or $m$) which is substantially the same as (EP-1$v$1$w$), and an input positive electrode finger thickness (220P-1$t$) is deposited on top of and is aligned to the elevated input positive electrode doped neutral region (EP-1$v$1). An input negative electrode finger (220N-1) with an input negative electrode finger width (220N-1$w$ or $m$) which is substantially the same as the elevated input negative electrode doped region width (EN-1$v$1$w$), and an input negative electrode finger thickness (220N-1$t$) is deposited on top of and is aligned to the elevated input negative electrode doped neutral region (EN-1$v$1). Regions (EP-1$v$1, EN-1$v$1, EP-1$d$1, EN-1$d$1) form an elevated input electrode doped region structure having an input electrode spacing region (ENP-1$v$1) with an input electrode spacing region width (ENP-1$v$1$w$ or $c$). A pitch (220NS-1$w$, 220PS-1$w$ or $b$) is defined as the sum of the input positive electrode finger width (220P-1$w$ or $m$) and the space between adjacent electrode doped regions (c) which is also equal to the sum of the input negative electrode finger width (220N-1$w$ or $m$) and the space between adjacent electrode doped regions (c): or b=m+c. The wavelength $\lambda_c$ of the surface acoustic waves (240) to be excited is substantially equal to two times of the pitch value: 2× (220NS-1$w$)=2b=2 (m+c).

The first doping concentration of the elevated input positive electrode doped neutral region (EP-1v1) is selected to be substantially the same as the second doping concentration of the elevated input negative electrode doped neutral region (EN-1v1). The first and the second doping concentrations of the elevated input positive and negative electrode doped regions are preferably to be in the range of $10^{13}$-$10^{20}$ cm$^{-3}$, dependent on the operation frequency and tuning rage required. In order to facilitate ohmic contacts, it is preferable to have a heavily doped surface layer (DN$^+$, DP$^+$) on the elevated input positive/negative electrode doped regions. Thicknesses of the heavily doped surface layers should be kept small (20 nm or less).

A first input DC basing voltage $V_{DC1}$ is applied through integrated input thin film bias resistors (RP-1, RN-1) and RF signals are applied through a positive RF contact (RFP) and a negative RF contact (RFN). The thin film bias resistors (RP-1, RN-1) are used to prevent leakage of RF signals to the DC bias circuit. The width (EP-1d1w) of the input positive electrode depletion region (EP-1d1) formed under the elevated input positive electrode doped neutral region (EP-1v1) and the width (EN-1d1w) of the input negative electrode depletion region (EN-1d1) formed under the elevated input negative electrode doped neutral region (EN-1v1) are substantially the same as (EP-1v1w) and (EN-1v1w). Due to the presence of these input electrode positive/negative depletion regions (EP-1d1, EN-1d1), the elevated input positive/negative electrode doped neutral regions (EP-1v1, EN-1v1) have reduced thickness (EP-1v1t, EN-1v1t) as compared with the thickness (DP-1t, DN-1t) of the elevated input positive/negative electrode doped regions (DP-1, DN-1).

In FIG. 3G, the elevated input positive/negative electrode doped neutral regions (EP-1v1, EN-1v1) are electrically conducting. (EP-1v1) forms a part of mass loading together with the input positive electrode finger (220P-1) and (EN-1v1) forms another part of mass loading together with the input negative electrode finger (220N-1). The input positive electrode depletion regions thickness (EN-1d1t) and input negative electrode depletion regions thickness (EP-1d1t) which are substantially the same in magnitude, are controlled by the polarity and the magnitude of the first input DC biasing voltage $V_{DC1}$. The first input DC basing voltage $V_{DC1}$ could be positive or negative in polarity with a small magnitude, provided that it can control and vary the thicknesses (EP-1d1t, EN-1d1t) of the input positive/negative electrode depletion regions (EP-1d1, EN-1d1) and the thickness (EP-1v1t, EN-1v1t) of the elevated input electrode doped neutral regions (EP-1v1, EN-1v1) to achieve frequency tuning for the surface acoustic waves to be excited in the IDT1.

Figure 3H:
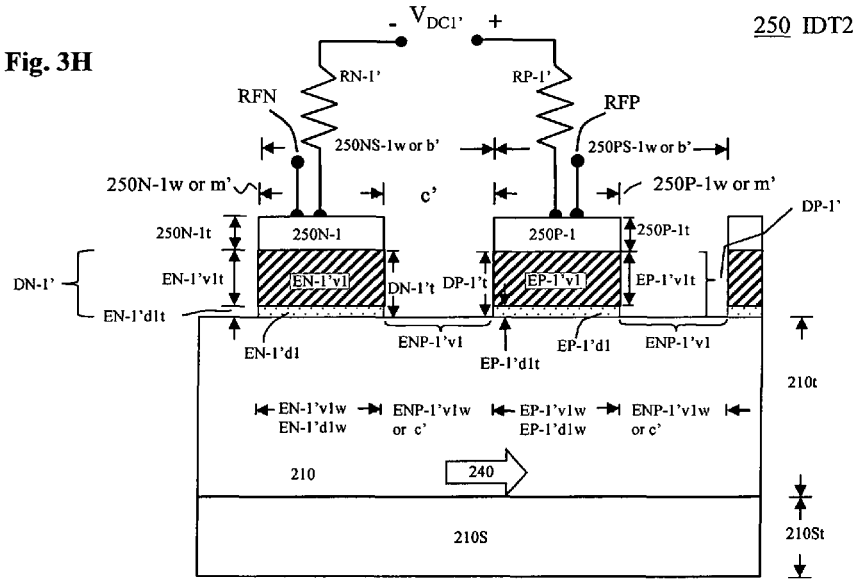
FIG. 3H is a schematic cross-sectional view taken along line B-B' in the tunable SAW filter (300a, FIG. 3A), showing a part of the IDT2 with an elevated output positive electrode doped neutral region and an elevated output negative electrode doped neutral region with opposite doping types, wherein a first output DC biasing voltage $V_{DC1'}$ is applied between the output positive electrode finger and the output negative electrode finger through integrated output thin film bias resistors (RN-1', RP-1') for tuning the frequency of the IDT2.

FIG. 3H is a schematic cross-sectional view of the tunable SAW filter (300a) taken along the line B-B' in FIG. 3A, showing a part of the output inter digital transducer IDT2 (250). An elevated output positive electrode doped region (DP-1') and an elevated output negative electrode doped region (DN-1') are deposited on a top surface of the first piezoelectric layer (210) which is on a support substrate (210S).

The elevated output positive electrode doped region (DP-1') of a thickness (DP-1't) consists of two parts: an elevated output positive electrode doped neutral region (EP-1'v1) having a thickness (EP-1'v1t) and a width (EP-1'v1w); and an elevated output positive electrode depletion region (EP-1'd1) having a thickness (EP-1'd1t) and a width (EP-1'd1w). The elevated output negative electrode doped region (DN-1') of a thickness (DN-1't) also has two parts: an elevated output negative electrode doped neutral region (EN-1'v1) having a thickness (EN-1'v1t) and a width (EN-1'v1w); and an elevated output negative electrode depletion region (EN-1'd1) having a thickness (EN-1'd1t) and a width (EN-1'd1w). The elevated output positive electrode doped neutral region (EP-1'v1) has an output first doping type (p-type or n-type) and the elevated output negative electrode doped neutral region (EN-1'v1) has an output second doping type which is opposite to the output first doping type.

An output positive electrode finger (250P-1) with an output positive electrode finger width (250P-1w or m') which is substantially the same as (EP-1'v1w), and an output positive electrode finger thickness (250P-1t) is deposited on top of and is aligned to the elevated output positive electrode doped neutral region (EP-1'v1). An output negative electrode finger (250N-1) with an output negative electrode finger width (250N-1w or m') which is substantially the same as the elevated output negative electrode doped region width (EN-1'v1w), and an output negative electrode finger thickness (250N-1t) is deposited on top of and is aligned to the elevated output negative electrode doped neutral region (EN-1'v1). Regions (EP-1'v1, EN-1'v1, EP-1'd1, EN-1'd1) form an elevated output electrode doped region structure having an output electrode spacing region (ENP-1'v1) with an output electrode spacing region width (ENP-1'v1w or c'). A pitch (250NS-1w, 250PS-1w or b') is defined as the sum of the output positive electrode finger width (250P-1w or m') and the space between adjacent electrode doped regions (c') which is also equal to the sum of the output negative electrode finger width (250N-1w or m') and the space between adjacent electrode doped regions (c'): or b'=m'+c'. The wavelength $\lambda_o$ of the surface acoustic waves (240) to be received is substantially equal to two times of the pitch value: 2× (250NS-1w)=2b'=2(m'+c').

The first doping concentration of the elevated output positive electrode doped neutral region (EP-1'v1) is selected to be substantially the same as the second doping concentration of the elevated output negative electrode doped neutral region (EN-1'v1). The first and the second doping concentrations of the elevated output positive and negative electrode doped regions are preferably to be selected in the range of $10^{13}$-$10^{20}$ cm$^{-3}$, dependent on the operation frequency and tuning rage required. In order to facilitate ohmic contacts, it is preferable to have a heavily doped surface layer (DN$^{+\prime}$, DP$^{+\prime}$) on the elevated output positive/negative electrode doped regions. Thicknesses of the heavily doped surface layers should be kept small (20 nm or less).

A first output DC basing voltage $V_{DC1'}$ is applied through integrated output thin film bias resistors (RP-1', RN-1') and RF signals are obtained through a positive RF contact (RFP) and a negative RF contact (RFN). The output thin film bias resistors (RP-1', RN-1') are used to prevent leakage of RF signals to the DC bias circuit. The width (EP-1'd1w) of the output positive electrode depletion region (EP-1'd1) under the elevated output positive electrode doped neutral region (EP-1'v1) and the width (EN-1'd1w) of the output negative electrode depletion region (EN-1'd1) under the elevated output negative electrode doped neutral region (EN-1'v1) are substantially the same as (EP-1'v1w) and (EN-1'v1w). Due to the presence of the output electrode positive/negative depletion regions (EP-1'd1, EN-1'v1), the elevated output positive/negative electrode doped neutral regions (EP-1'v1, EN-1'v1) have a reduced thickness (EP-1'v1t, EN-1'v1t) as compared with the thickness (DP-1't, DN-1't) of the elevated output positive/negative electrode doped regions (DP-1', DN-1').

In FIG. 3H, the elevated output positive/negative electrode doped neutral regions (EP-1'v1, EN-1'v1) are electrically conducting. (EP-1'v1) forms a part of mass loading together with the output positive electrode finger (250P-1) and (EN-1'v1) forms another part of mass loading together with the output negative electrode finger (250N-1). The output positive electrode depletion regions thickness (EN-1'd1t) and output negative electrode depletion regions thickness (EP-1'd1t) which are substantially the same in magnitude, are controlled by the polarity and the magnitude of the first output DC biasing voltage $V_{DC1'}$. The first output DC basing voltage $V_{DC1'}$ could be positive or negative in polarity with a small magnitude, provided that it can control and vary the thicknesses (EP-1'd1t, EN-1'd1t) of the output positive/negative electrode depletion regions (EP-1'd1, EN-1'd1) and the thickness (EP-1'v1t, EN-1'v1t) of the elevated output electrode doped neutral regions (EP-1'v1, EN-1'v1) to achieve frequency tuning for the surface acoustic waves to be received in the IDT2.

To effectively isolate RF signals and allow application of DC biasing, the resistance values R of the input and output thin film bias resistors (RN-1, RP-1, RN-1' and RP-1') are preferably greater than 200Ω, or more preferably greater than 1000Ω. On the other hand, the resistance value R should not be too large in order to keep a low RC constant to reduce the unwanted switching delay time $\tau_1 = R_1 \times C$ of the SAW device.

The integrated input and output thin film bias resistors may have different shapes such as rectangle, square, triangle, trapezium, and parallelogram etc. Take rectangle shape as an example: the input and output thin film bias resistors may have a bias resistor length $R_L$, a bias resistor width $R_W$, a bias resistor thickness $R_T$. The bias resistor thickness is preferably less than 2 micron and is more preferably less than 0.5 micron to facilitate patterning by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as $RuO_2$, TaN, ZnO, ZnON, InSnO, InSnON, ZnInO, ZnInON, ZnSnO, ZnSnON, $Bi_2Ru_2O_7$, $RuO_2$, $Bi_2Ir_2O_7$, and other semiconductors such as Si, as long as the resistance of the integrated thin film bias resistors R is greater than 200Ω (or greater than 1000Ω) and has stable thermal properties. The thin film layers forming the integrated thin film bias resistors may be deposited by vacuum methods such as evaporation, DC sputtering and RF sputtering in a vacuum chamber with Ar gas or a gas mixture of Ar, $O_2$ and/or $N_2$.

Figure 3I:
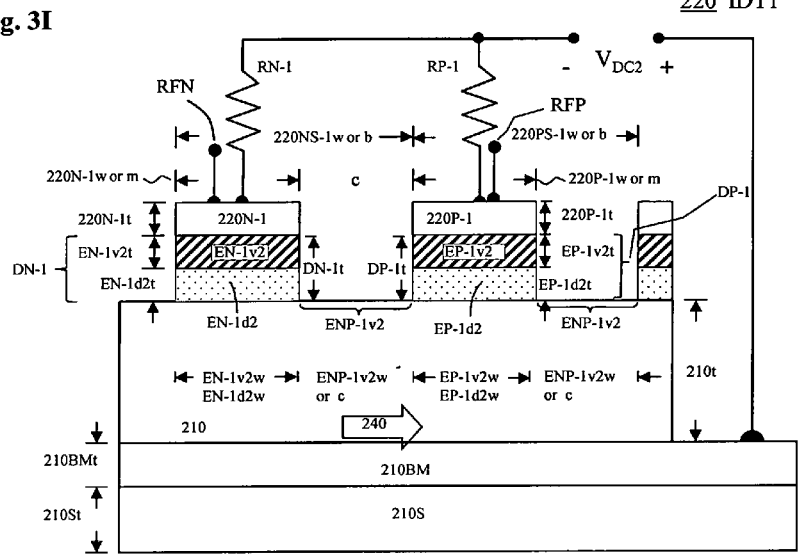
FIG. 3I is a schematic cross-sectional view taken along line A-A' in the tunable SAW filter (300a, FIG. 3A), showing a part of the IDT1 with elevated input positive and negative electrode doped neutral regions of the same doping type and a bottom electrode layer. The elevated positive and negative electrode doped neutral regions are connected together and a second input DC biasing voltage $V_{DC2}$ is applied between the electrode fingers and the bottom electrode layer through integrated input thin film bias resistors (RN-1, RP-1) for tuning the frequency of the IDT1.
Figure 3J:
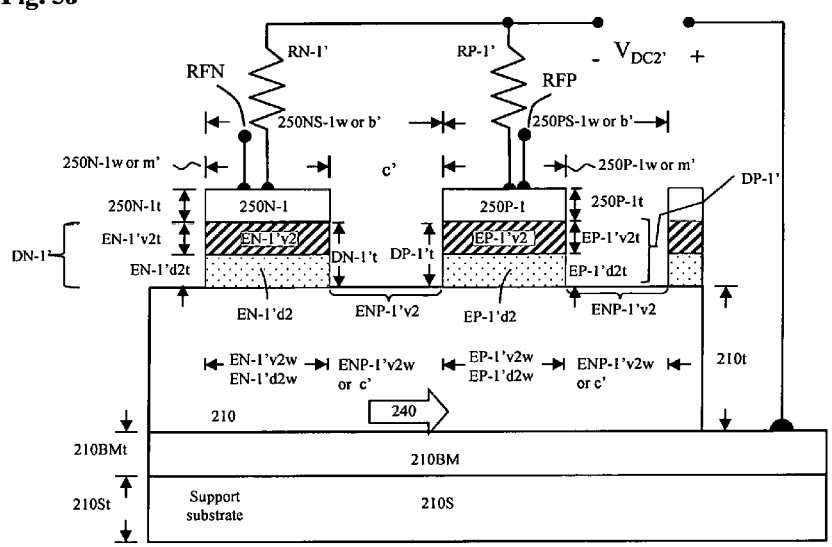
FIG. 3J is a schematic cross-sectional view taken along line B-B' in the tunable SAW filter (300a, FIG. 3A), showing a part of the IDT2 with elevated output positive and negative electrode doped neutral regions with the same doping type. In this structure, the elevated output positive and negative electrode doped neutral regions are connected together and a second output DC biasing voltage $V_{DC2'}$ is applied between the electrode fingers and the bottom electrode layer through integrated output thin film bias resistors (RN-1', RP-1') for tuning of the frequency of the IDT2.

IDTs with Elevated Electrode Doped Regions of the Same Doping Type:

A schematic cross sectional view of the IDT1 (220) and the IDT2 (250), taken along lines A-A' and B-B' respectively in the SAW filter (300a) shown in FIG. 3A, are shown in FIGS. 3I and 3J for IDTs with elevated input positive/negative electrode doped regions and elevated output positive/negative electrode doped regions, wherein the doping type of the positive electrode doped regions and the negative electrode doped regions are the same.

FIG. 3I is a schematic cross-sectional view of a part of IDT1 (220) in a tunable and adjustable SAW filter considerably similar to the IDT1 (220) shown in FIG. 3G. An elevated input positive electrode doped region (DP-1) and an elevated input negative electrode doped region (DN-1) are deposited on a top surface of the first piezoelectric layer (210) which is on a support substrate (210S).

The elevated input positive electrode doped region (DP-1) of a thickness (DP-10 consists of two parts: an elevated input positive electrode doped neutral region (EP-1v2) having a thickness (EP-1v2t) and a width (EP-1v2w); and an elevated input positive electrode depletion region (EP-1d2) having a thickness (EP-1d2t) and a width (EP-1d2w). The elevated input negative electrode doped region (DN-1) of a thickness (DN-1t) also has two parts: an elevated input negative electrode doped neutral region (EN-1v2) having a thickness (EN-1v2t) and a width (EN-1v2w); and an elevated input negative electrode depletion region (EN-1d2) having a thickness (EN-1d2t) and a width (EN-1d2w). The elevated input positive electrode doped neutral region (EP-1v2) has an input first doping type (p-type or n-type) and the elevated input negative electrode doped neutral region (EN-1v2) has an input second doping type.

An input positive electrode finger (220P-1) with an input positive electrode finger width (220P-1w or m) which is substantially the same as (EP-1v2w), and an input positive electrode finger thickness (220P-1t) is deposited on top of and is aligned to the elevated input positive electrode doped neutral region (EP-1v2). An input negative electrode finger (220N-1) with an input negative electrode finger width (220N-1w or m) which is substantially the same as the elevated input negative electrode doped region width (EN-1v2w), and an input negative electrode finger thickness (220N-1t) is deposited on top of and is aligned to the elevated input negative electrode doped neutral region (EN-1v2). The input positive electrode finger (220P-1) makes an ohmic contact to the elevated input positive electrode doped neutral region (EP-1v2) and the input negative electrode finger (220N-1) makes an ohmic contact to the elevated input negative electrode doped neutral region (EN-1v2). Regions (EP-1v2, EN-1v2, EP-1d2, EN-1d2) form an elevated electrode doped region structure having an input electrode spacing region (ENP-1v2) with an input electrode spacing region width (ENP-1v1w or c). A pitch (220NS-1w, 220PS-1w or b) is defined as the sum of the input positive electrode finger width (220P-1w or m) and the space between adjacent electrode doped regions (c) which is also equal to the sum of the input negative electrode finger width (220N-1w or m) and the space between adjacent electrode doped regions (c): or b=m+c. The wavelength of the surface acoustic waves (240) to be excited is substantially equal to two times of the pitch value: 2× (220NS-1w)=2b=2(m+c).

It should be emphasized that in this structure, the input first doping type of the elevated input positive electrode doped neutral region (EP-1v2) and the input second doping type of the elevated input negative electrode doped neutral region (EN-1v2) are selected to be the same (either p-type or n-type). The first doping concentration of the elevated input positive electrode doped neutral region (EP-1v2) is also selected to be substantially the same as the second doping concentration of the elevated input negative electrode doped neutral region (EN-1v2). The first and the second doping concentrations are preferably to be controlled in the range of $10^{13}$-$10^{20}$ cm$^{-3}$, depending on the operation frequency and tuning rage required.

Due to the same doping type of the elevated input positive and negative electrode doped neutral regions, the input electrode fingers (220P-1) and (220N-1) are connected together through integrated input thin film bias resistors (RP-1, RN-1) to a negative terminal of the input DC biasing voltage source, whereas a bottom electrode layer (210BM) of a thickness (210BMt) is connected to a positive terminal of the DC biasing voltage source, so that a second input DC biasing voltage $V_{DC2}$ is applied between the input electrode fingers (220P-1, 220N-1) and the bottom electrode layer (210BM). Although the doping types and the biasing arrangement for IDT1 in FIG. 3I are different from IDT1 (220) shown in FIG. 3G, the elements in FIG. 3I are marked the same way as the IDT1 in FIG. 3G for convenience. RF signals are applied between a positive RF contact (RFP) and a negative RF contact (RFN). The integrated input thin film bias resistors (RP-1, RN-1) are used to prevent leakage of RF signals to the DC bias circuit.

In FIG. 3I, (EP-1$d2w$) is selected to be substantially the same as (EN-1$d2w$) in magnitude. Furthermore, widths (EP-1$d2w$) and (EN-1$d2w$) are substantially the same as widths (EP-1$v2w$) and (EN-1$v2w$). Due to the presence of the input electrode positive/negative depletion regions (EP-1$d2$, EN-1$d2$), the elevated input positive/negative electrode doped neutral regions (EP-1$v2$, EN-1$v2$) have a reduced thickness (EP1$v2t$, EN-1$v2t$) as compared with the thickness (DP-1$t$, DN-1$t$) of the elevated input positive/negative electrode doped regions (DP-1, DN-1).

In FIG. 3I, the elevated input positive and negative electrode doped neutral regions (EP-1$v2$, EN-1$v2$) are electrically conducting. (EP-1$v2$) forms a part of mass loading together with the input positive electrode finger (220P-1) and (EN-1$v2$) forms the other part of mass loading together with the input negative electrode finger (220N-1). The second input DC biasing voltage $V_{DC2}$ is applied to achieve controlling and varying the mass loading associated with the input electrode fingers (220P-1, 220N-1), which is done by controlling and varying the thickness (EP-1$v2t$, EN-1$v2t$) of the input positive and negative electrode doped neutral regions (EP-1$v2$, EN-1$v2$) through controlling and varying the thickness (EP-1$d2t$, EN-1$d2t$) of the input positive and negative electrode depletion region (EP-1$d2$, EN-1$d2$). The second input DC basing voltage $V_{DC2}$ could be positive or negative in polarity but with a small magnitude, provided that it can control and vary the thickness of the input positive/negative electrode depletion regions to achieve frequency tuning for the surface acoustic waves to be excited in the IDT1.

In order to facilitate ohmic contacts, it is preferable to have a heavily doped surface layer on the elevated input positive electrode doped regions and the elevated input negative electrode doped regions. Thicknesses of the heavily doped surface layers should be kept small (in the order of 20 nm or less).

FIG. 3J is a schematic cross-sectional view of a part of IDT2 (250) in a tunable and adjustable SAW filter considerably similar to the IDT2 (250) shown in FIG. 3H. An elevated output positive electrode doped region (DP-1') and an elevated output negative electrode doped region (DN-1') are deposited on a top surface of the first piezoelectric layer (210) which is on a support substrate (210S).

The elevated output positive electrode doped region (DP-1') of a thickness (DP-1'$t$) consists of two parts: an elevated output positive electrode doped neutral region (EP-1'$v2$) having a thickness (EP-1'$v2t$) and a width (EP-1'$v2w$); and an elevated output positive electrode depletion region (EP-1'$d2$) having a thickness (EP-1'$d2t$) and a width (EP-1'$d2w$). The elevated output negative electrode doped region (DN-1') of a thickness (DN-1'$t$) also has two parts: an elevated output negative electrode doped neutral region (EN-1'$v2$) having a thickness (EN-1'$v2t$) and a width (EN-1'$v2w$); and an elevated output negative electrode depletion region (EN-1'$d2$) having a thickness (EN-1'$d2t$) and a width (EN-1'$d2w$). The elevated output positive electrode doped neutral region (EP-1'$v2$) has an output first doping type (p-type or n-type) and the elevated output negative electrode doped neutral region (EN-1'$v2$) has an output second doping type.

An output positive electrode finger (250P-1) with an output positive electrode finger width (250P-1$w$ or $m'$) which is substantially the same as (EP-1'$v2w$), and an output positive electrode finger thickness (250P-1$t$) is deposited on top of and is aligned to the elevated output positive electrode doped neutral region (EP-1'$v2$). An output negative electrode finger (250N-1) with an output negative electrode finger width (250N-1$w$ or $m'$) which is substantially the same as the elevated output negative electrode doped region width (EN-1'$v2w$), and an output negative electrode finger thickness (250N-1$t$) is deposited on top of and is aligned to the elevated output negative electrode doped neutral region (EN-1'$v2$). The output positive electrode finger (250P-1) makes an ohmic contact to the elevated output positive electrode doped neutral region (EP-1'$v2$) and the output negative electrode finger (250N-1) makes an ohmic contact to the elevated output negative electrode doped neutral region (EN-1'$v2$). Regions (EP-1'$v2$, EN-1'$v2$, EP-1'$d2$, EN-1'$d2$) form an elevated electrode doped region structure having an output electrode spacing region (ENP-1'$v2$) with an output electrode spacing region width (ENP-1'$v1w$ or $c'$). A pitch (250NS-1$w$, 250PS-1$w$ or $b'$) is defined as the sum of the output positive electrode finger width (250P-1$w$ or $m'$) and the space between adjacent electrode doped regions ($c'$) which is also equal to the sum of the output negative electrode finger width (250N-1$w$ or $m'$) and the space between adjacent electrode doped regions ($c'$): or $b'=m'+c'$. The wavelength $\lambda_o$ of the surface acoustic waves (240) to be received is substantially equal to two times of the pitch value: 2× (250NS-1$w$)=2$b'$=2($m'+c'$).

It should be emphasized that in this structure, the output first doping type of the elevated output positive electrode doped neutral region (EP-1'$v2$) and the output second doping type of the elevated output negative electrode doped neutral region (EN-1'$v2$) are selected to be the same (either p-type or n-type). The first doping concentration of the elevated output positive electrode doped neutral region (EP-1'$v2$) is also selected to be substantially the same as the second doping concentration of the elevated output negative electrode doped neutral region (EN-1'$v2$). The first and the second doping concentrations are preferably to be controlled in the range of $10^{13}$-$10^{20}$ cm$^{-3}$, depending on the operation frequency and tuning rage required.

Due to the same doping type of the elevated output positive and negative electrode doped neutral regions, the output electrode fingers (250P-1) and (250N-1) are connected together through integrated input thin film bias resistors (RP-1', RN-1') to a negative terminal of the output DC biasing voltage source, whereas a bottom electrode layer (210BM) of a thickness (210BMt) is connected to a positive terminal of the DC biasing voltage source, so that a second output DC biasing voltage $V_{DC2'}$ is applied between the output electrode fingers (250P-1, 250N-1) and the bottom electrode layer (210BM). Although the doping types and the biasing arrangement for IDT2 in FIG. 3J are different from IDT2 (250) shown in FIG. 3H, the elements in FIG. 3J are marked the same way as the IDT2 in FIG. 3H for convenience. RF signals are obtained between a positive RF contact (RFP) and a negative RF contact (RFN). The integrated output thin film bias resistors (RP-1', RN-1') are used to prevent leakage of RF signals to the DC bias source circuit.

In FIG. 3J, (EP-1'$d2w$) is selected to be substantially the same as (EN-1'$d2w$) in magnitude. Furthermore, widths (EP-1'$d2w$) and (EN-1'$d2w$) are substantially the same as widths (EP-1'ν2w) and (EN-1'ν2w). Due to the presence of the output electrode positive/negative depletion regions (EP-1'd2, EN-1'd2), the elevated output positive/negative electrode doped neutral regions (EP-1'ν2, EN-1'ν2) have a smaller thickness (EP1'ν2t, EN-1'ν2t) as compared with the thickness (DP-1't, DN-1't) of the elevated input positive/negative electrode doped regions (DP-1', DN-1').

In FIG. 3J, the elevated output positive and negative electrode doped neutral regions (EP-1'ν2, EN-1'ν2) are electrically conducting. (EP-1'ν2) forms a part of mass loading together with the output positive electrode finger (250P-1) and (EN-1'ν2) forms the other part of mass loading together with the output negative electrode finger (250N-1). The second output DC biasing voltage $V_{DC2'}$ is applied to achieve controlling and adjusting the mass loading associated with the output electrode fingers (250P-1, 250N-1), which is done by controlling and adjusting the thickness (EP-1'ν2t, EN-1'ν2t) of the output positive and negative electrode doped neutral regions (EP-1'ν2, EN-1'ν2) through controlling and adjusting the thickness (EP-1'd2t, EN-1'd2t) of the output positive and negative electrode depletion region (EP-1'd2, EN-1'd2). The second output DC basing voltage $V_{DC2'}$ could be positive or negative in polarity but with a small magnitude, provided that it can control and vary the thickness of the output positive/negative electrode depletion regions to achieve frequency tuning for the surface acoustic waves to be detected in the IDT2.

In order to facilitate ohmic contacts, it is preferable to have a heavily doped surface layer on the elevated output positive electrode doped regions and the elevated output negative electrode doped regions. Thicknesses of the heavily doped surface layers should be kept small (in the order of 20 nm or less).

To effectively isolate RF signals and allow applications of DC biasing voltages, the resistance values R of the integrated input and output thin film bias resistors (RN-1, RP-1, RN-1' and RP-1') are preferably greater than 200Ω, or more preferably greater than 1000Ω. But the resistance value R should not be too large in order to keep a low RC constant low to reduce the unwanted switching delay time $\tau_1 = R_1 \times C$ of the SAW device.

The integrated input and output thin film bias resistors may have different shapes such as rectangle, square, triangle, trapezium, parallelogram etc. Take rectangle shape as an example: the integrated input and output thin film bias resistors may have a bias resistor length $R_L$, a bias resistor width $R_W$ and a bias resistor thickness $R_T$. The bias resistor thickness ($R_T$) is preferably less than 2 micron and is more preferably less than 0.5 micron to facilitate patterning either by etching or by lift-off.

Materials of the integrated thin film bias resistors (RN-1, RP-1, RN-1' and RP-1') may be metals such as Ni, Cr, Ta, W, Mo and their alloys including NiCr. They may also be metal oxides, metal nitrides and metal oxynitrides such as $RuO_2$, TaN, ZnO, ZnON, InSnO, InSnON, ZnSnO, ZnInON, ZnSnO, ZnSnON, $Bi_2Ru_2O_7$, $RuO_2$, $Bi_2Ir_2O_7$, and other semiconductors such as Si, as long as the resistance of the integrated thin film bias resistors R is greater than 200Ω (or greater than 1000Ω) and has stable thermal properties. The thin film layers forming the integrated thin film bias resistors may be deposited by vacuum methods such as evaporation, DC sputtering and RF sputtering in a vacuum chamber with Ar gas or a gas mixture of Ar, $O_2$ and/or $N_2$.

Materials of the bottom electrode layer (210BM) may be selected from a group of metals and doped semiconductors, preferably doped piezoelectric semiconductors in the group of: Ti, Al, W, Pt, Mo, Cr, Pd, Ta, Cu, Cr, Au, Ni, Ag, Ru, Ir, AlN, GaN, AlGaN, ZnO, GaAs, AlAs, AlGaAs and their combinations.

Surface Acoustic Wave Reflectors

Figure 4:
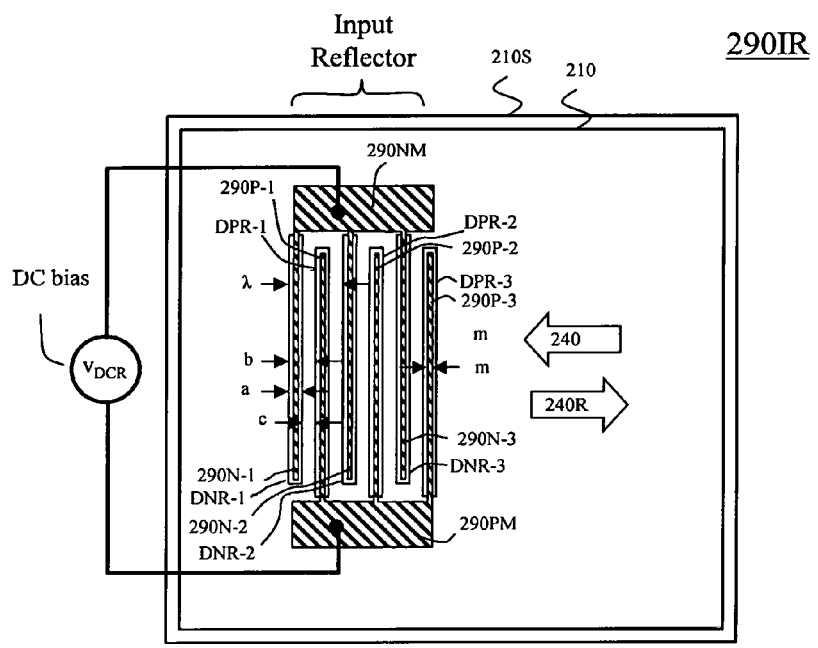
FIG. 4 is a schematic top view showing a tunable input SAW reflector 2901R having input electrode pads, input electrode fingers, input electrode doped regions. A DC biasing voltage is applied to control the MR and ML and the frequency of the surface acoustic waves to be reflected.

FIG. 4 shows a schematic top view of a surface acoustic wave (SAW) input reflector (290IR) with tunable frequency, according to this invention. It comprises a first piezoelectric layer (210) on a support substrate (210S); an input positive electrode pad (290PM) and an input negative electrode pad (290NM) which may be advantageously constructed on the first piezoelectric layer (210); a plurality of input positive electrode doped regions (DPR-1, DPR-2, DPR-3) which are doped piezoelectric semiconductor; a plurality of metallic input positive electrode fingers (290P-1, 290P-2, 290P-3) each on one of the input positive electrode doped regions; a plurality of input negative electrode doped regions (DNR-1, DNR-2, DNR-3) which are doped piezoelectric semiconductor; a plurality of metallic input negative electrode fingers (290N-1, 290N-2, 290N-3) each on one of the input negative electrode doped regions. In FIG. 4, the input positive electrode doped regions and the input negative electrode doped regions may be embedded or elevated.

By applying a DC biasing voltage $V_{DCR}$ and adjusting the magnitude of $V_{DCR}$ to control the metallization ratio and the mass loading associated with the positive and negative electrodes, the frequency of the surface acoustic waves to be reflected may be controlled to be the same as the frequency of the surface acoustic waves (240) excited by the input IDT1 (220) and/or to be the same as the frequency of the surface acoustic wave to be received by the output IDT2 (250) in the SAW filters (300a in FIG. 3A). As a result of above tuning, when placed beside the input IDT1 (220), majority of SAW waves (240) are reflected as reflected SAW waves (240R) and any unwanted loss of energy for the SAW wave is reduced. A SAW output reflector with tunable and adjustable frequency for the output inter digital transducer IDT2 may also be constructed with the same structure for the SAW input reflector (290IR) to minimize loss of surface acoustic wave energy for receiving. When placed beside the output inter digital transducer IDT2 (250), any unwanted loss of energy for the surface acoustic wave to be received is reduced.

What is claimed is:

1. A frequency tunable SAW inter digital transducer IDT structure with embedded electrode doped regions for surface acoustic wave devices comprising a support substrate with a support substrate thickness;

a first piezoelectric layer with a first piezoelectric layer thickness on said support substrate;

a plurality of positive electrode doped regions embedded in said first piezoelectric layer, said positive electrode doped regions are piezoelectric semiconductors having a first doping type;

a plurality of negative electrode doped regions embedded in said first piezoelectric layer, said negative electrode doped regions are piezoelectric semiconductors having a second doping type, wherein each said negative electrode doped region is between two adjacent positive electrode doped regions with a center to center distance between a positive electrode doped region and an adjacent negative electrode doped region controlled to a pitch b;

a plurality of metallic positive electrode fingers each on one embedded positive electrode doped regions, said positive electrode fingers are connected to a positive electrode pad;

a plurality of metallic negative electrode fingers each on one embedded negative electrode doped regions, said negative electrode fingers are connected to a negative electrode pad; and a DC biasing voltage is connected to said IDT through thin film bias resistors to control and vary dimensions of depletion regions formed in said embedded positive electrode doped regions and embedded negative electrode doped regions so that a loading mass and a metallization ratio associated with each said positive electrode fingers and each said negative electrode fingers are adjusted to achieve frequency tuning for surface acoustic waves to be excited or to be received in said IDT, said thin film bias resistors are integrated with said SAW IDT and resistance value of said thin film bias resistors is controlled to be sufficiently large to isolate RF signals from DC biasing circuit, whereas said positive electrode pad and negative electrode pad are connected to an electrical signal source or to a signal receiver to excite surface acoustic waves in said IDT or to receive surface acoustic waves from said IDT.

2. A frequency tunable SAW inter digital transducer IDT structure with embedded electrode doped regions for surface acoustic wave devices as defined in claim 1, wherein material for said support substrate is selected from a material group including: $LiNbO_3$, $LiTaO_3$, PZT, AlN, GaN, AlGaN, ZnO, GaAs, AlAs, AlGaAs, $Al_2O_3$, $BaTiO_3$, quartz and $KNbO_3$, Si, sapphire, quartz, glass, and plastic.

3. A frequency tunable SAW inter digital transducer IDT structure with embedded electrode doped regions for surface acoustic wave devices as defined in claim 1, wherein material of said first piezoelectric layer is selected from a material group of piezoelectric materials including: $LiNbO_3$, $LiTaO_3$, ZnO, AlN, GaN, AlGaN, $LiTaO_3$, GaAs, AlGaAs and others, as long as they are piezoelectric and with sufficiently high coupling coefficient.

4. A frequency tunable SAW inter digital transducer IDT structure with embedded electrode doped regions for surface acoustic wave devices as defined in claim 1, wherein materials of said embedded positive electrode doped regions and said embedded negative electrode doped regions are selected from a group including: AlN, GaN, AlGaN, ZnO, GaAs, AlAs, AlGaAs and others, as long as they are piezoelectric with sufficient acoustic coupling coefficients and are semiconducting and can be doped to n-type or p-type conduction with a doping concentration preferably in a range of $10^{13}$ to $10^{20}$ cm$^{-3}$ for effective frequency tuning.

5. A frequency tunable SAW inter digital transducer IDT structure with embedded electrode doped regions for surface acoustic wave devices as defined in claim 1, wherein said first doping type of said positive electrode doped regions is opposite to said second doping type of said negative electrode doped regions and said DC biasing voltage is applied between said positive electrode pad and said negative electrode pad through said thin film bias resistors to tune and adjust frequency of said surface acoustic waves.

6. A frequency tunable SAW inter digital transducer IDT structure with embedded electrode doped regions for surface acoustic wave devices as defined in claim 1, wherein thicknesses of said embedded positive electrode doped regions and said embedded negative electrode doped regions are controlled to be in a range of 10 to 2000 nm.

7. A frequency tunable SAW inter digital transducer IDT structure with embedded electrode doped regions for surface acoustic wave devices as defined in claim 1, wherein materials for said positive electrode fingers and said negative electrode fingers are selected from a group of: Ti, Al, W, Pt, Mo, Cr, Pd, Ta, Cu, Cr, Au, Ni, Ag, Ru, Ir and other metals and their alloys, whereas thicknesses of said positive electrode fingers and negative electrode fingers are selected in a range of 10 to 400 nm, dependent on the operation frequency and the tuning range required.

8. A frequency tunable SAW inter digital transducer IDT structure with embedded electrode doped regions for surface acoustic wave devices as defined in claim 1, wherein materials of said thin film bias resistors are selected from a group including: Ni, Cr, Ta, W, Mo, NiCr, $RuO_2$, TaN, ZnO, ZnON, InSnO, InSnON, ZnInO ZnInON, ZnSnO, ZnSnON, $Bi_2Ru_2O_7$, $RuO_2$, $Bi_2Ir_2O_7$, and other semiconductors such as Si, as long as the resistance value of the thin film bias resistors is greater than 200Ω and has stable thermal properties.

9. A frequency tunable SAW inter digital transducer IDT structure with embedded electrode doped regions for surface acoustic wave devices as defined in claim 1, further comprising a bottom electrode layer sandwiched between said first piezoelectric layer and said support substrate, wherein said first doping type is the same as said second doping type, said positive electrode pad and negative electrode pad are connected together and said DC biasing voltage is applied between said positive and negative electrode pads and said bottom electrode layer to tune and adjust frequency of said surface acoustic waves, materials of said bottom electrode layer are selected from a group including: Ti, Al, W, Pt, Mo, Cr, Pd, Ta, Cu, Cr, Au, Ni, Ag, Ru, Ir, AlN, GaN, AlGaN, ZnO, GaAs, AlAs, AlGaAs and their combinations.

10. A frequency tunable SAW inter digital transducer IDT structure with embedded electrode doped regions for surface acoustic wave devices as defined in claim 1, further comprising a heavily doped layer on top of each said embedded negative electrode doped regions and another heavily doped layer on top of each said embedded positive electrode doped regions to reduce contact resistance.

11. A frequency tunable SAW inter digital transducer IDT structure with embedded electrode doped regions for surface acoustic wave devices as defined in claim 1, wherein said frequency tunable SAW inter digital structure is a tunable input inter digital transducer for receiving RF signals and producing surface acoustic waves.

12. A frequency tunable SAW inter digital transducer IDT structure with embedded electrode doped regions for surface acoustic wave devices in as defined in claim 1, wherein said frequency tunable SAW inter digital structure is a tunable output inter digital transducer for receiving surface acoustic waves and converting them to RF signals.

13. A frequency tunable SAW inter digital transducer IDT structure with embedded electrode doped regions for surface acoustic wave devices as defined in claim 1, wherein said frequency tunable SAW inter digital structure is a tunable reflector for surface acoustic waves.

14. A frequency tunable SAW inter digital transducer IDT structure with elevated electrode doped regions for surface acoustic wave devices comprising
a support substrate with a support substrate thickness;
a first piezoelectric layer with a first piezoelectric layer thickness;
a plurality of elevated positive electrode doped regions on said first piezoelectric layer, said elevated positive electrode doped regions are piezoelectric semiconductors having a first doping type;
a plurality of elevated negative electrode doped regions on said first piezoelectric layer, said negative electrode doped regions are piezoelectric semiconductors having a second doping type, wherein each said elevated negative electrode doped region is between two adjacent elevated positive electrode doped regions with a center to center distance between an elevated positive electrode doped region and an adjacent elevated negative electrode doped region controlled to a pitch b;

a plurality of metallic positive electrode fingers connected to a positive electrode pad, each said positive electrode fingers on one of respective elevated positive electrode doped regions;

a plurality of metallic negative electrode fingers connected to a negative electrode pad, each said negative electrode fingers on one of respective elevated negative electrode doped regions; and a DC biasing voltage is connected to said IDT through thin film bias resistors to control and vary dimensions of depletion regions formed in said elevated positive electrode doped regions and elevated negative electrode doped regions so that loading masses associated with each said positive electrode fingers and each said negative electrode fingers are adjusted to achieve frequency tuning for surface acoustic waves to be excited or to be received in said IDT, said thin film bias resistors are integrated with said SAW IDT and resistance value of said thin film bias resistors is controlled to be sufficiently large to isolate RF signals from DC biasing circuit, whereas said positive electrode pad and negative electrode pad are connected to an electrical signal source or to a signal receiver to excite or receive surface acoustic waves.

15. A frequency tunable SAW inter digital transducer IDT structure with elevated electrode doped regions for surface acoustic wave devices as defined in claim 14, wherein material for said support substrate is selected from a material group including: LiNbO$_3$, LiTaO$_3$, PZT, AlN, GaN, AlGaN, ZnO, GaAs, AlAs, AlGaAs, Al$_2$O$_3$, BaTiO$_3$, quartz and KNbO$_3$, Si, sapphire, quartz, glass, and plastic.

16. A frequency tunable SAW inter digital transducer IDT structure with elevated electrode doped regions for surface acoustic wave devices as defined in claim 14, wherein material of said first piezoelectric layer is selected from a material group of piezoelectric materials including: LiNbO$_3$, LiTaO$_3$, ZnO, AlN, GaN, AlGaN, LiTaO$_3$, GaAs, AlGaAs and others, as long as they are piezoelectric and with sufficiently high coupling coefficient.

17. A frequency tunable SAW inter digital transducer IDT structure with elevated electrode doped regions for surface acoustic wave devices as defined in claim 14, wherein materials of said elevated positive electrode doped regions and said elevated negative electrode doped regions are selected from a group including: AlN, GaN, AlGaN, ZnO, GaAs, AlAs, AlGaAs and others, as long as they are piezoelectric with sufficient acoustic coupling coefficients and are semiconducting and can be doped to n-type or p-type conduction with a doping concentration preferably in a range of $10^{13}$ to $10^{20}$ cm$^{-3}$ for effective frequency tuning.

18. A frequency tunable SAW inter digital transducer IDT structure with elevated electrode doped regions for surface acoustic wave devices as defined in claim 14, wherein said first doping type of said elevated positive electrode doped regions is opposite to said second doping type of said elevated negative electrode doped regions and said DC biasing voltage is applied between said positive electrode pad and said negative electrode pad through said thin film bias resistors to tune and adjust frequency of said surface acoustic waves.

19. A frequency tunable SAW inter digital transducer IDT structure with elevated electrode doped regions for surface acoustic wave devices as defined in claim 14, wherein thicknesses of said elevated positive electrode doped regions and said elevated negative electrode doped regions are controlled preferably to be in a range of 10 to 2000 nm.

20. A frequency tunable SAW inter digital transducer IDT structure with elevated electrode doped regions for surface acoustic wave devices as defined in claim 14, wherein materials for said positive electrode fingers and said negative electrode fingers are selected from a group of: Ti, Al, W, Pt, Mo, Cr, Pd, Ta, Cu, Cr, Au, Ni, Ag, Ru, Ir and other metals and their alloys, whereas thickness of said positive electrode fingers and said negative electrode fingers is selected to be in a range of 10 to 400 nm, dependent on the operation frequency and the tuning range required.

21. A frequency tunable SAW inter digital transducer IDT structure with elevated electrode doped regions for surface acoustic wave devices as defined in claim 14, wherein materials of said thin film bias resistors are selected from a group including: Ni, Cr, Ta, W, Mo, NiCr, RuO$_2$, TaN, ZnO, ZnON, InSnO, InSnON, ZnInO ZnSnON, ZnSnO, ZnSnON, Bi$_2$Ru$_2$O$_7$, RuO$_2$, Bi$_2$Ir$_2$O$_7$, and other semiconductors such as Si, as long as the resistance value of the thin film bias resistors is greater than 200Ω and has stable thermal properties.

22. A frequency tunable SAW inter digital transducer IDT structure with elevated electrode doped regions for surface acoustic wave devices as defined in claim 14, further comprising a bottom electrode layer sandwiched between said first piezoelectric layer and said support substrate, wherein said first doping type is the same as said second doping type, said positive electrode pad and said negative electrode pad are connected together and said DC biasing voltage is applied between said positive and negative electrode pads and said bottom electrode layer to tune and adjust frequency of said surface acoustic waves, materials of said bottom electrode layer are selected from a group including: Ti, Al, W, Pt, Mo, Cr, Pd, Ta, Cu, Cr, Au, Ni, Ag, Ru, Ir, AlN, GaN, AlGaN, ZnO, GaAs, AlAs, AlGaAs and their combinations.

23. A frequency tunable SAW inter digital transducer IDT structure with elevated electrode doped regions for surface acoustic wave devices as defined in claim 14, further comprising a heavily doped layer on each said elevated negative electrode doped regions and another heavily doped layer on each said elevated positive electrode doped regions to reduce contact resistance.

24. A frequency tunable SAW inter digital transducer IDT structure with elevated electrode doped regions for surface acoustic wave devices as defined in claim 14, wherein said frequency tunable SAW inter digital structure is a tunable input inter digital transducer for receiving RF signals and producing surface acoustic waves.

25. A frequency tunable SAW inter digital transducer IDT structure with elevated electrode doped regions for surface acoustic wave devices in as defined in claim 14, wherein said frequency tunable SAW inter digital structure is a tunable output inter digital transducer for receiving surface acoustic waves and converting them to RF signals.

26. A frequency tunable SAW inter digital transducer IDT structure with elevated electrode doped regions for surface acoustic wave devices as defined in claim 14, wherein said frequency tunable SAW inter digital structure is a tunable reflector for surface acoustic waves.

* * * * *